(12) United States Patent
Shinozaki

(10) Patent No.: US 6,480,033 B2
(45) Date of Patent: *Nov. 12, 2002

(54) SEMICONDUCTOR DEVICE

(75) Inventor: Naoharu Shinozaki, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/317,619

(22) Filed: May 25, 1999

(65) Prior Publication Data
US 2002/0027451 A1 Mar. 7, 2002

(30) Foreign Application Priority Data

May 27, 1998 (JP) .......................... 10-146114

(51) Int. Cl.$^7$ .......................................... H03K 19/094
(52) U.S. Cl. .................. 326/105; 326/93; 365/233; 365/230.06
(58) Field of Search ................ 326/93.105; 365/230.06, 365/233

(56) References Cited

U.S. PATENT DOCUMENTS

| | | | | |
|---|---|---|---|---|
| 5,559,752 A | * | 9/1996 | Stephens, Jr. et al. | 365/233 |
| 5,566,108 A | | 10/1996 | Kitamura | 365/233 |
| 5,703,831 A | * | 12/1997 | Sawada | 365/233 |
| 5,881,019 A | * | 3/1999 | Koshikawa | 365/233 |
| 5,893,925 A | * | 4/1999 | Sawada | 711/167 |
| 5,912,858 A | * | 6/1999 | Tomita et al. | 365/233 |

FOREIGN PATENT DOCUMENTS

| | | |
|---|---|---|
| JP | 8-102188 | 4/1996 |
| JP | 2697633 | 9/1997 |

* cited by examiner

Primary Examiner—Karl D. Frech
Assistant Examiner—Steven S. Paik
(74) Attorney, Agent, or Firm—Arent Fox Kintner Plotkin & Kahn, PLLC

(57) ABSTRACT

A semiconductor integrated circuit including a semiconductor device has a command decoder unit for decoding command signals synchronously with an external clock. An internal signal whose timing precedes the timing of the command decoder unit decoding the command signals is used to reset the command decoder unit. Preferably, a signal produced by a DLL is used as the internal signal. Consequently, a margin in timing of actuating the semiconductor device is expanded.

7 Claims, 18 Drawing Sheets

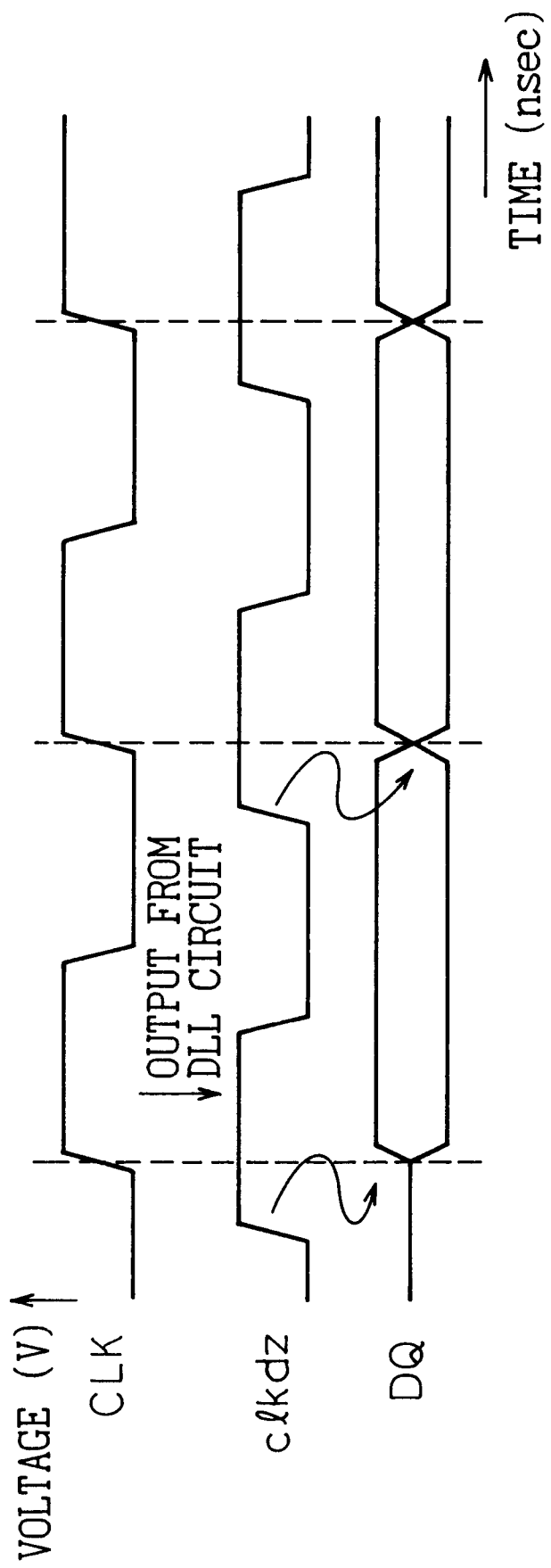

SEMICONDUCTOR DEVICE

BACKGROUND OF THE INVENTION

1. Field of the Invention

The present invention relates to a semiconductor integrated circuit including a semiconductor device having a circuit such as a command decoder that has the function of decoding command signals, which represent various kinds of commands, synchronously with an internal clock, and judging the states of the command signals.

In such a command decoder or the like, normally, states or patterns of various command signals are judged in order to produce a command judgment signal synchronous with an internal clock (normally referred to as a clocked judgment signal). The command judgment signals are output through command pins of an output port.

In recent years, dynamic random access memory (hereinafter abbreviated to DRAM) that is a semiconductor integrated circuit having a semiconductor device, which includes the command decoder or the like incorporated therein, has been required to exhibit a high processing speed.

However, for suppressing multi-signal selection, that is simultaneous selection of two or more than two clocked judgment signals to be output through command pins, the high processing speed exhibited by the SDRAM must be sacrificed. Otherwise, it becomes necessary to fully suppress a skew equivalent to a dispersion in timing between different command signals. The present invention relates to a means for coping with the multi-signal selection of clocked judgment signals and the skew between command signals while meeting the request for a higher processing speed to be exhibited by the DRAM.

2. Description of the Related Art

Normally, data is input as an external input signal to the DRAM. The input data is processed according to a clocked judgment signal produced by judging the states or patterns of command signals. Consequently, desired data is output. Especially, novel DRAMs including a synchronous DRAM (usually abbreviated to SDRAM) capable of transferring data at a high speed is designed to provide a data transfer speed corresponding to a frequency of, for example, 100 MHz or higher than 100 MHz. At this time, input or output of data and judgment of the states of the command signals must be carried out at a predetermined accurate phase relative to an externally supplied high-speed external clock. In other words, as far as the SDRAM is concerned, according to what timing a clocked judgment signal is output through a command pin of a command decoder or the like is important for outputting desired data quickly and stably.

Now, for a better understanding of problems on semiconductor integrated circuits including conventional semiconductor devices having the function of judging the states of command signals, the configuration and operations of conventional semiconductor devices will be described later with reference to FIG. 1 to FIG. 4 mentioned in "BRIEF DESCRIPTION OF THE DRAWINGS."

A circuit block diagram showing the outline configuration of a first example of conventional semiconductor devices having the function of judging the states of command signals, is illustrated in FIG. 1. A conventional semiconductor device of the first example shown in FIG. 1 has a first current mirror circuit 310, a second current mirror circuit 320, and a third current mirror circuit 330. The first current mirror circuit 310, second current mirror circuit 320, and third current mirror circuit 330 amplify various command signals input through external control pins and thus determine the output levels of the command signals. The various command signals are, for example, a row address strobe /RAS, a column address strobe /CAS, and a write enabling signal /WE. Herein, the first to third current mirror circuits amplify the row address strobe /RAS, column address strobe /CAS, and write enabling signal /WE, thus producing command determination signals rasz, casz, and wez. The command determination signals rasz, casz, and wez are high ("H": high voltage) or low ("L": low voltage).

In FIG. 1, there are shown a first latch circuit 410, second latch circuit 420, and third latch circuit 430 for holding the command determination signals rasz, casz, and wez sent from the first to third current mirror circuits. The first to third latch circuits are each realized with a set-reset flip-flop (normally abbreviated to SFF). The first to third latch circuits latch information of command signals (that is, the command determination signals rasz, casz, and wez) synchronously with a clock (that is, an internal clock clkz). The clock is input via a current mirror circuit 500 for a clock through an external clock (CLK) input clock pin. The first to third latch circuits output command information latch signals rascz, cascz, and wecz that are in phase with the input command determination signals. The first to third latch circuits also output command information latch signals rascx, cascx, and wecx that are out of phase with the command determination signals. The current mirror circuit 500 for a clock functions as an input buffer for converting the level of the external clock CLK so as to produce an internal clock clkz.

Furthermore, in FIG. 1, there is shown a command decoder 100 for decoding the command information latch signals output from the first to third latch circuits. The command decoder 100 judges the states of the command signals including the row address strobe /RAS, column address strobe /CAS, and write enabling signal /WE. The command decoder 100 judges the states of the command signals from command information signals latched synchronously with the internal clock clkz by the first to third latch circuits. The states of the command signals indicate an operation to be performed by the SDRAM or the like. Moreover, the results of judgment made on the states of the command signals by the command decoder 100 are reported in the form of a "H" level (high-level) or "L" level (low-level) clocked judgment signal via an inverter through an associated node. The "H" level or "L" level clocked judgment signal is, for example, a clocked judgment signal AZ or BZ. The inverter is, for example, inverters 110 and 120. The node is, for example, a node n01 or n11.

The practical circuitry of the current mirror circuits, latch circuits, and command decoder will be described later in "DESCRIPTION OF THE PREFERRED EMBODIMENTS."

Referring to FIG. 2, the actions of a conventional semiconductor device of a second example of conventional semiconductor devices including the current mirror circuits, latch circuits, and command decoder will be clarified below. FIG. 2 shows the waveforms of input and output signals of components of the current mirror circuits, latch circuits, and command decoder. However, for brevity's sake, the waveforms of the input and output signals of the first current mirror circuit 310 and second current mirror circuit 320 will be shown as representatives of those of the input and output signals of the plurality of current mirror circuits. Likewise, the waveforms of the input and output signals of the first latch circuit 410 and second latch circuit 420 will be shown as representatives of those of the input and output signals of the plurality of latch circuits.

Referring to FIG. 2, signals (the command determination signals rasz and casz in FIG. 2) are transmitted to the output stages of the first and second current mirror circuits 310 and 320. The signals are synchronous with and in phase with the row address strobe /RAS and column address strobe /CAS input through the external control pins. The internal clock clkz in phase with the clock CLK (that is, the external clock) input through the clock pin is transmitted to the output stage of the current mirror circuit 500 for a clock. In this case, the command determination signals rasz and casz and the internal clock clkz make a transition from "L" level to "H" level or a transition from "H" level to "L" level substantially simultaneously.

Data items (the command determination signals rasz and casz) output from the first and second current mirror circuits are determined by the first and second current mirrors 310 and 320. Thereafter, the states of the data items are latched synchronously with the internal clock clkz by the first and second latch circuits 410 and 420. The first and second latch circuits 410 and 420 output the command information latch signals rasca and casca (output signals outz2) as signals in phase with input signals inz (command determination signals rasz and casz). The first and second latch circuits 410 and 420 also output command information latch signals rascx and cascx (output signals outx2) as signals out of phase with the input signals inz.

Depending on the characteristics of the first latch circuit (or second latch circuit), the response speed exhibited by the semiconductor device when a signal inz output from the first latch circuit (or second latch circuit) makes a transition from "L" level to "H" level may be different from the response speed exhibited when the signal inz makes a transition from "H" level to "L" level. Furthermore, it may take place that the output signal outz2 in phase with the input signal inz and the output signal outx2 out of phase therewith do not make a transition simultaneously. One of the reasons lies in that the response speed of an n-channel MOS transistor (NMOS transistor) is much higher than that of a p-channel MOS transistor (PMOS transistor). The NMOS transistor is actuated when an input signal makes a transition from "L" level to "H" level, while the PMOS transistor is actuated when the input signal makes a transition from "H" level to "L" level. In the conventional semiconductor device of the first example, when the input signal inz changes from "L" level to "H" level (that is, changes from an unselected state to a selected state), the output signals outz2 and outx2 are output relatively quickly. When the input signal changes from "H" level to "L" level (that is, changes from the selected state to the unselected state), the output signals outz2 and outx2 are output relatively slowly. This case will be described as an example.

Under the above conditions, an attempt is made to judge the states of command signals in consideration of the logic of simple decoding performed by the command decoder 100. The attempt would be discouraged because when a selected signal is driven to an unselected state, an event of multi-signal selection may occur due to a skew between the command signals. For preventing the multi-signal selection, a duty ratio of the conventional semiconductor device of the first example (that is, the drivability of a circuit) is lowered for driving an unselected signal to a selected state. This causes the semiconductor device to exhibit a relatively low response speed. The duty ratio of the semiconductor device is raised for driving a selected signal to the unselected state so that the semiconductor device will exhibit a relatively high response speed. The dimensions of the command decoder 100 are set according to the duty ratio of the semiconductor device.

The clocked judgment signals AZ and BZ to be output from the command decoder 100 are command judgment signals that become "H" when selected. When the signals input to the command decoder 100 are all driven to become "H", an output signal become "H" to be selected.

To be more specific, the duty ratio of the semiconductor device for driving a PMOS transistor included in a NAND circuit on the first stage of the command decoder 100 is made much higher than that for driving an NMOS transistor. The reverse is true of an inverter on the output stage of the command decoder 100. As is apparent from the waveforms of signals shown in FIG. 2, an input node n01 (or node n11) of an inverter 110 (or inverter 120) on the output stage is likely to become "H" high. In contrast, an output node thereof is likely to become "L". Thus, the dimensions of the command decoder 100 are determined so that the semiconductor device will exhibit a high response speed when driving a selected signal to an unselected state.

In the conventional semiconductor device of the first example, as shown in FIG. 2, the command information latch signal rascz and command information latch signal cascx become "H", and the node n01 becomes "L". The clocked judgment signal AZ is therefore selected and a desired action is performed. However, the logical states of the command information latch signals rascz and cascz are about to be selected because of a skew. The node n11 is therefore going to be driven to become "L". Owing to the foregoing dimensions, the clocked judgment signal BZ will not be selected. The semiconductor device will act normally.

FIG. 3 is a circuit block diagram showing the outline configuration of a semiconductor device of the second example of conventional semiconductor devices having the function of judging the states of command signals. The conventional semiconductor device of the second example shown in FIG. 3 has, in addition to the current mirror circuits, latch circuits, and command decoder included in the first example, a dummy latch circuit 600. The dummy latch circuit 600 monitors the latest action of a latch circuit. In the conventional semiconductor device of the second example, a dummy latch signal dsffz is produced by the dummy latch circuit 600. The dummy latch signal dsffz is supplied simultaneously to a first latch circuit 440, a second latch circuit 450, and a third latch circuit 460 respectively. This is intended to make the transition timing of output signals of the latch circuits mutually consistent, and to eventually overcome a skew. The practical circuitry of the dummy latch circuit and latch circuits will be described later in "DESCRIPTION OF THE PREFERRED EMBODIMENTS."

In this case, the configuration of the first to third current mirror circuits 310 to 330 and that of the command decoder 100 are identical to those in the first example. The description of the first to third current mirror circuits and command decoder will be omitted.

The dummy latch circuit 600 in FIG. 3 fixes the input signal inz, which is input to a normally employed latch circuit, at "L" level. An output signal of the dummy latch circuit 600 (that is, the dummy latch signal dsffz) is pulsed. The response speed of the conventional semiconductor device of the second example is the lowest when an input signal is "L". When the dummy latch circuit produces a pulsed output signal, all the SFFs are supposed to have completed data latching. If each latch circuit produces the output signals outz2 according to the timing that the pulsed output signal is produced, the foregoing operations will be performed.

To be more specific, the conventional semiconductor device of the second example shown in FIG. 3 has a transfer gate connected to the output node of each latch circuit. The transfer gate is turned on or off using the dummy latch signal dsffz that is an output signal of the dummy latch circuit. When the dummy latch signal dsffz is output, the state of each control pin is latched at two output nodes a and b of each latch circuit. When the action of an inverter is counted as one step and an action of turning on the transfer gate is counted as one step, outputs of each latch circuit are produced after a logical delay of two steps.

For making clear the operations of the conventional semiconductor device of the second example, FIG. 4 shows the waveforms of input and output signals of the current mirror circuits, dummy latch circuit, latch circuits, and command decoder. However, for brevity's sake, the waveforms of input and output signals of the first current mirror circuit 310 and second current mirror circuit 320 will be shown as representatives of those of the plurality of current mirror circuits. The waveforms of input and output signals of the first latch circuit 440 and second latch circuit 450 will be shown as representatives of those of the plurality of latch circuits.

Referring to FIG. 4, similarly to FIG. 2, signals (command determination signals rasz and casz shown in FIG. 3) are transmitted to the output stages of the first and second current mirror circuits 310 and 320. The signals are synchronous with, and in phase with, a row address strobe /RAS and column address strobe /CAS which are input through external control pins. An internal clock clkz in phase with a clock CLK input through a clock pin is transmitted to the output stage of the current mirror circuit 500 for a clock. In this case, the command determination signals rasz and casz and the internal clock clkz make a transition from "L" level to "H" level or a transition from "H" level to "L" level substantially simultaneously.

As is apparent from FIG. 4, the dummy latch signal dsffz is produced according to the timing that the logical state of either the output node a or b of each latch circuit is determined last. Two steps of actions made until the transfer gate of each latch circuit is turned on with the dummy latch signal dsffz are regarded as a margin in timing of actuating the semiconductor device. The levels of the output signals of each latch circuit, for example, the command information latch signals rascz and rascx or cascz and cascx, are varied simultaneously.

Furthermore, referring to FIG. 4, similarly to FIG. 2, the command information latch signals rascz and cascx are driven to become "H" and the node n01 is driven to become "L". Consequently, the clocked judgment signal AZ is selected. However, in this case, the logical states of the command information latch signals rascz and cascz are about to be selected because of a skew. The node n11 is going to be driven to become "L". Owing to the aforesaid dimensions, the clocked judgment signal BZ will not be selected, and the semiconductor device will operate normally.

The use of the dummy latch signal dsffz will presumably lead to a considerably reduced risk of multi-signal selection of command signals caused by a skew. The dimensions of the command decoder must be, similarly to that in the first example, set according to the duty ratio of the semiconductor device. That is to say, the duty ratio of the semiconductor device is lowered for driving an unselected signal to a selected state. The duty ratio thereof is raised for driving a selected signal to an unselected state. One of the reasons will be described. Namely, when the duty ratio of the semiconductor device for driving an unselected output signal to the selected state is high, multi-signal selection may occur because input signals are all synchronous with one another.

As mentioned above, in either of the conventional semiconductor devices shown in FIG. 1 and FIG. 3, the dimensions of the command decoder must be adjusted to prevent the occurrence of multi-signal selection of command signals due to a skew. Moreover, the adjustment must be made according to the duty ratio of the semiconductor device. Namely, the duty ratio of the semiconductor device is lowered for driving an unselected signal to the selected state. The duty ratio thereof is raised for driving a selected signal to the unselected state.

However, even when the dimensions of the command decoder are adjusted as mentioned above, it is hard to perfectly prevent multi-signal selection stemming from a skew. Moreover, in the conventional semiconductor devices, the dimensions of the command decoder are adjusted at the sacrifice of the high processing speed of an SDRAM or the like. The SDRAM or the like performs a desired operation in this state. This poses a problem in that the request for the high processing speed of the SDRAM or the like cannot be met fully. Consequently, a margin in timing of accessing or actuating a semiconductor device decreases. This may become a bottleneck in developing high-speed devices.

SUMMARY OF THE INVENTION

The present invention attempts to solve the foregoing problems. An object of the present invention is to provide a semiconductor integrated circuit having a semiconductor device capable of preventing occurrence of multi-signal selection of command signals due to a skew when judging the states of various command signals, and making it possible to perform operations at a high speed.

To accomplish the above object, according to the present invention, a semiconductor integrated circuit having a semiconductor device has a command decoder unit for decoding command signals synchronously with an internal clock. An internal signal whose timing of the internal signal precedes the timing of the command decoder unit decoding the command signals is used to reset the command decoder unit.

Preferably, in the semiconductor integrated circuit of the present invention, a signal produced by a delayed lock loop (DLL) is used as the internal signal.

Moreover, according to the present invention, the semiconductor integrated circuit has a command decoder unit for decoding command signals synchronously with an external clock. A first internal signal whose timing precedes the timing of the command decoder unit decoding the command signals is used to reset the command decoder unit. A second internal signal produced after the states of the command signals to be input to the command decoder unit are determined is used to activate the command decoder.

Preferably, a signal produced by a DLL is used as the first internal signal.

More preferably, a signal produced by a dummy latch circuit for monitoring the last operation of a command signal hold circuit for holding the states of the command signals, is used as the second internal signal.

Furthermore, according to the first aspect of the present invention, a semiconductor integrated circuit having a semiconductor device comprises a command decoder unit for decoding command signals synchronously with an external clock; and a command decoder control unit for producing a command decoder control signal used to reset the command decoder unit in response to an internal signal whose timing precedes the timing of the command decoder unit decoding the command signals, for driving the command decoder control signal to the first state, and for supplying the command decoder control signal to the command decoder unit.

Preferably, the duty ratio of the semiconductor integrated circuit may be such that the semiconductor integrated circuit exhibits a high response speed when driving an unselected transistor that is a component of the command decoder unit to a selected state, and exhibits a low response speed when-driving a selected transistor to an unselected state. Nevertheless, it is possible to prevent two or more than two command signals being selected simultaneously because of inconsistency in timing of the command signals. Moreover, the operations can be performed at a high speed.

Furthermore, according to the second aspect of the present invention, a semiconductor integrated circuit having a semiconductor device comprises a command decoder unit for decoding command signals synchronously with an external clock; and a command decoder control unit for producing a command decoder control signal used to reset the command decoder unit in response to a first internal signal whose timing precedes the timing of the command decoder unit decoding the command signals, for driving the command decoder control signal to the first state, and for supplying the command decoder control signal to the command decoder. The command decoder control signal is used to reset the command decoder unit. Thereafter, when a second internal signal is used to activate the command decoder, the command decoder control signal is changed from the first state to the second state. The second internal signal is produced after the states of the command signals to be input to the command decoder unit are determined.

Preferably, according to the second aspect, similarly to the first aspect, the duty ratio of the semiconductor integrated circuit may be such that the semiconductor integrated circuit exhibits a high response speed when driving an unselected transistor that is a component of the command decoder unit to a selected state, and exhibits a low response speed when driving a selected transistor to an unselected state. Nevertheless, it is possible to prevent two or more than two command signals being selected simultaneously because of inconsistency in timing of the command signals. Besides, operations can be performed at a high speed.

In short, in the semiconductor integrated circuit having the semiconductor device of the present invention, an internal signal is used to inactivate (reset) a command decoder unit. The internal signal is produced by a DLL or the like, and leading command signals that are input through external control pins and then held. In other words, the timing of the internal signal precedes the timing of the command decoder unit judging the logical state of each command pin. Furthermore, after the internal signal is used to inactivate the command decoder unit and the information of each command pin is determined, the command decoder unit is activated in order to judge the states of various command signals. There is no fear that two or more than two command signals may be selected simultaneously because of a skew between the command signals.

According to the present invention, when the states of various command signals are judged, the occurrence of multi-signal selection of command signals stemming from a skew can be prevented perfectly. Furthermore, according to the present invention, the dimensions of the command decoder unit need not be adjusted in consideration of the adverse effect of a skew between command signals. High-speed operations can be realized for an SDRAM or the like.

BRIEF DESCRIPTION OF THE DRAWINGS

The above object and features of the present invention will be more apparent from the following description of the preferred embodiments with reference to the accompanying drawings, wherein:

FIG. 19 is a timing chart for explaining the operations of the DLL shown in FIG. 18.

DESCRIPTION OF THE PREFERRED EMBODIMENTS

Referring to FIG. 5 to FIG. 19, a basic embodiment and preferred embodiments of the present invention will be described below.

Figure 5:
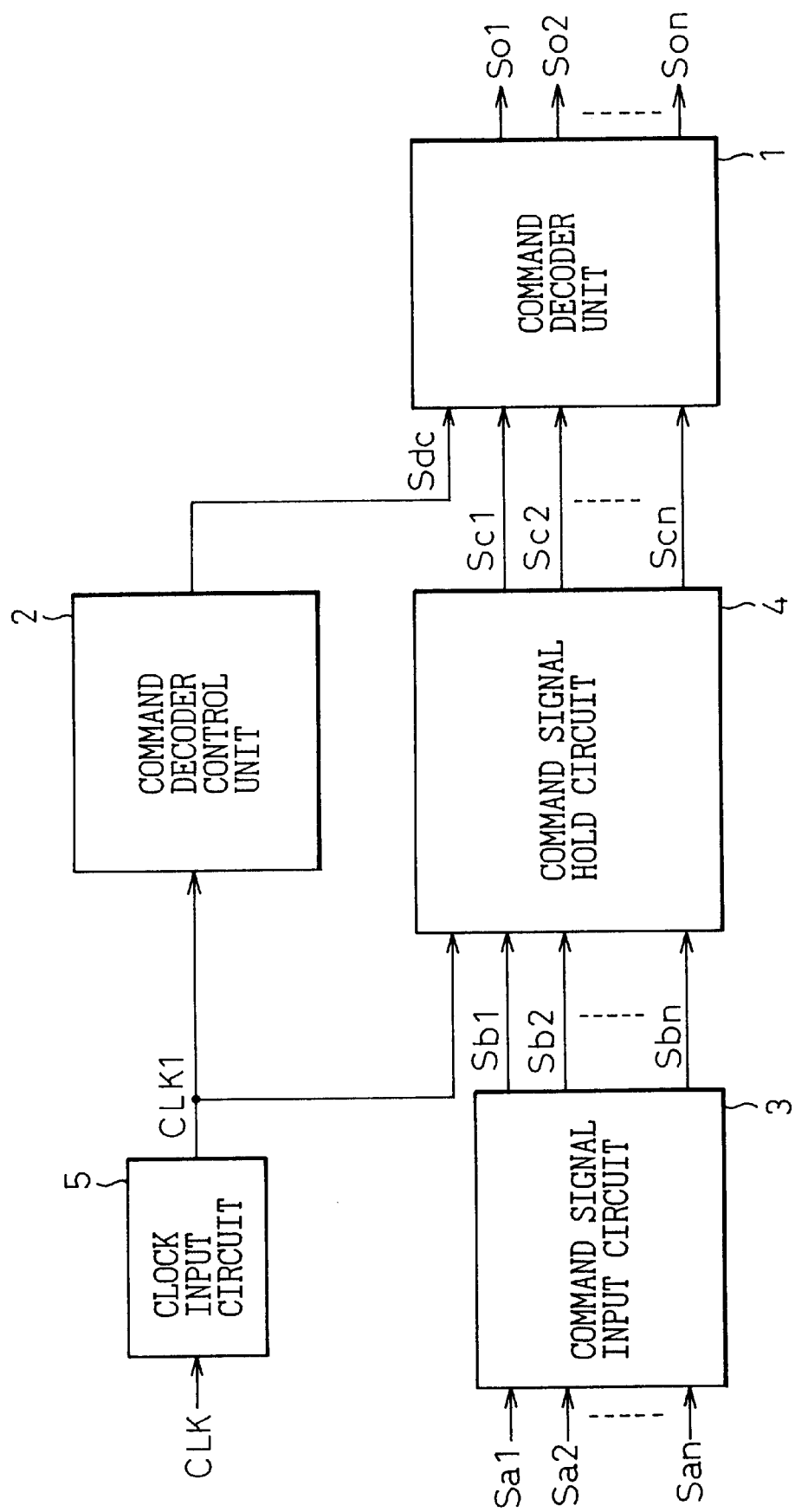
FIG. 5 is a block diagram showing the configuration of a basic embodiment based on the principles of the present invention.

FIG. 5 is a block diagram showing the basic embodiment based on the principles of the present invention. Herein, the configuration of a semiconductor integrated circuit including a semiconductor device having the function of judging the states of command signals is illustrated concisely.

For solving the aforesaid problems, according to the basic embodiment of the present invention, a semiconductor device has a command decoder unit 1. The command decoder unit 1 decodes command signals Sa1 to San, which represent various kinds of commands, synchronously with an internal clock CLK1, and judges the states of the command signals. In the semiconductor device, an internal signal Sdc whose timing precedes the timing of the command decoder 1 judging the states of the command signals is used to inactivate (reset) the command decoder unit 1.

Figure 1:
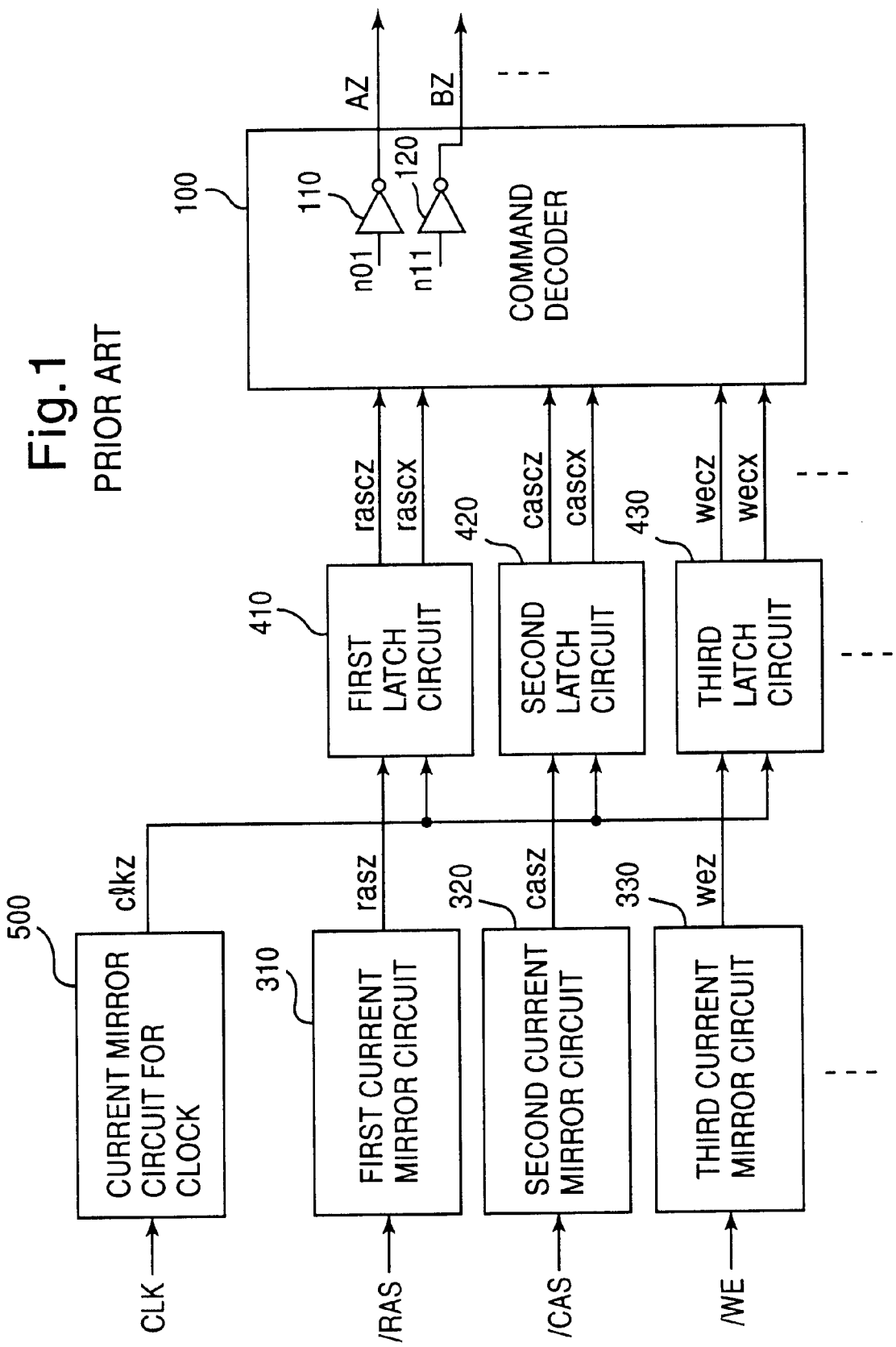
FIG. 1 is a circuit block diagram showing the outline configuration of a semiconductor device of the first example of conventional semiconductor devices having the function of judging the states of command signals.

Furthermore, the semiconductor device of the basic embodiment shown in FIG. 5 has a clock input circuit 5 for producing an internal clock CLK1 by converting the level of an external clock CLK. The clock input circuit 5 functions, substantially like the current mirror circuit 500 for a clock in the conventional semiconductor device (See FIG. 1 and FIG. 3), as an input buffer for buffering the external clock CLK. Moreover, the semiconductor device has a command signal input circuit 3 for determining "H" or "L" levels of various command signals Sa1 to San and thus producing command determination signals Sb1 to Sbn.

Furthermore, the semiconductor device of the basic embodiment shown in FIG. 5 has a command signal hold circuit 4. The command signal hold circuit 4 holds the command determination signals Sb1 to Sbn, which are output from the command signal input circuit 3, with the command determination signals synchronized with the internal clock CLK1. The command signal hold circuit 4 is, substantially like the plurality of latch circuits in the conventional semiconductor device (See FIG. 1 and FIG. 3), composed of a plurality of set-reset flip-flops and others. The command signal hold circuit 4 produces command information latch signals Sb1 to Sbn associated with the command determination signals Sb1 to Sbn. The command decoder unit 1 judges the states of various command signals synchronous with the internal clock CLK 1 from the command information latch signals Sb1 to Sbn. The command decoder unit 1 then outputs associated command judgment signals So1 to Son.

Preferably, according to the basic embodiment of the present invention, a signal produced by a delayed lock loop (DLL) and leading the internal clock is used as the internal signal Sdc. The timing timing of the internal signal Sdc precedes the timing of the command decoder 1 judging the states of the command signals. Consequently, a margin in timing of actuating the semiconductor device can be expanded.

On the other hand, according to the basic embodiment of the present invention, a semiconductor device has a command decoder unit 1. The command decoder unit 1 decodes command signals, which represent various commands, synchronously with an external clock, and judges the states of the command signals. A first internal signal whose timing precedes the timing of the command decoder unit 1 judging the states of the command signals is used to inactivate the command decoder unit 1. Thereafter, a second internal signal produced after the states of the command signals to be input to the command decoder unit 1 are determined is used to activate the command decoder unit 1.

Preferably, according to the basic embodiment of the present invention, a signal synchronous with a clock, which leads in phase the internal clock and is produced by a DLL, is used as the first internal signal. Consequently, a margin in timing of actuating the semiconductor device can be expanded.

Preferably, according to the basic embodiment of the present invention, a signal produced by a dummy latch circuit is used as the second internal signal. The dummy latch circuit monitors the last operation of a command signal hold circuit 4 for holding the states of the command signals.

Furthermore, the first practical example relating to the basic embodiment of the present invention is a semiconductor device having a command decoder unit 1. The command decoder unit 1 decodes command signals, which represent various kinds of commands, synchronously with an external clock, and judges the states of the command signals. The semiconductor device has a command decoder control unit 2. The command decoder control unit 2 produces a command decoder control signal Sdc used to inactivate the command decoder unit 1 according to an internal signal. The timing of the internal signal precedes the timing of the command decoder unit 1 judging the states of the command signals. The command decoder control unit 2 drives the command decoder control signal to a first state, and supplies the same to the command decoder unit 1.

Furthermore, the second practical example relating to the basic embodiment of the present invention is a semiconductor device having a command decoder unit 1. The command decoder unit 1 decodes command signals, which represent various kinds of commands, synchronously with an external clock, and judges the states of the command signals. The semiconductor device has a command decoder control unit 2. The command decoder control unit 2 produces a command decoder control signal used to inactivate the command decoder unit 1 according to a first internal signal. The timing of the first internal signal precedes the timing of the command decoder unit 1 judging the states of the command signals. The command decoder control unit 2 drives the command decoder control signal to a first state, and supplies it to the command decoder unit. The command decoder control signal is used to inactivate the command decoder unit 1. Thereafter, a second internal signal produced after the states of the command signals to be input to the command decoder unit 1 are determined is used to activate the command decoder unit 1. At this time, the command decoder control signal is changed from the first state to a second state.

Preferably, in either of the first and second practical examples of the present invention, the duty ratio of the semiconductor device may be such that the semiconductor device exhibits a high response speed when driving an unselected transistor that is a component of the command decoder 1 to a selected state, and exhibits a low response speed when driving a selected transistor changes to an unselected state. Nevertheless, it is possible to prevent two or more command signals being selected simultaneously because of inconsistency in timing of the command signals. Moreover, operations can be performed at a high speed.

In short, according to the basic embodiment of the present invention, an internal signal is used to inactivate (reset) a command decoder. The internal signal is a signal produced by a DLL, and leading command signals that are input through external control pin and then held. That is to say, the timing of the internal signal precedes the timing of judging the logical states of command pins of a command decoder unit. After the information of the command pins is determined, the command decoder unit is activated in order to judge the states of various command signals. There is therefore no fear that two or more command signals may be selected simultaneously because of a skew between the command signals.

According to the basic embodiment of the present invention, it can be prevented perfectly that, when the states of various command signals are judged, multi-signal selection of command signals occurs because of a skew. Furthermore, according to the basic embodiment of the present invention, the dimensions of the command decoder unit need not be adjusted in consideration of the adverse effect of a skew between command signals. Consequently, it becomes possible for an SDRAM or the like to perform operations at a high speed.

For a better understanding of the configurations and features of preferred embodiments of the present invention, the configuration and actions of an SDRAM to which the embodiments are adapted will be described first. The preferred embodiments will be described later in conjunction with FIG. 8 to FIG. 19.

Figure 6:
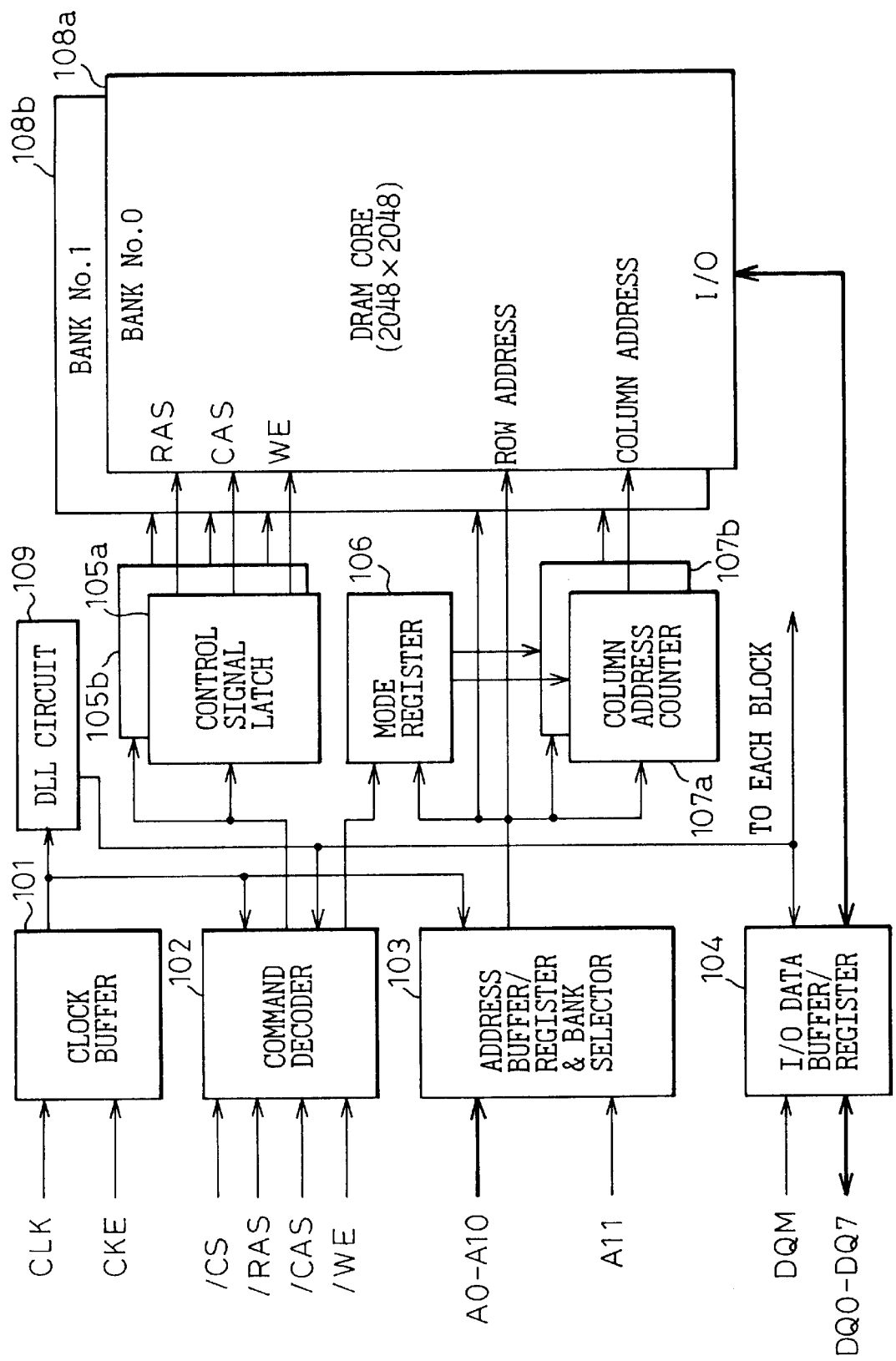
FIG. 6 is a block diagram showing the outline configuration of a synchronous DRAM to which a semiconductor integrated circuit including a semiconductor device of the present invention is applied.
Figure 7:
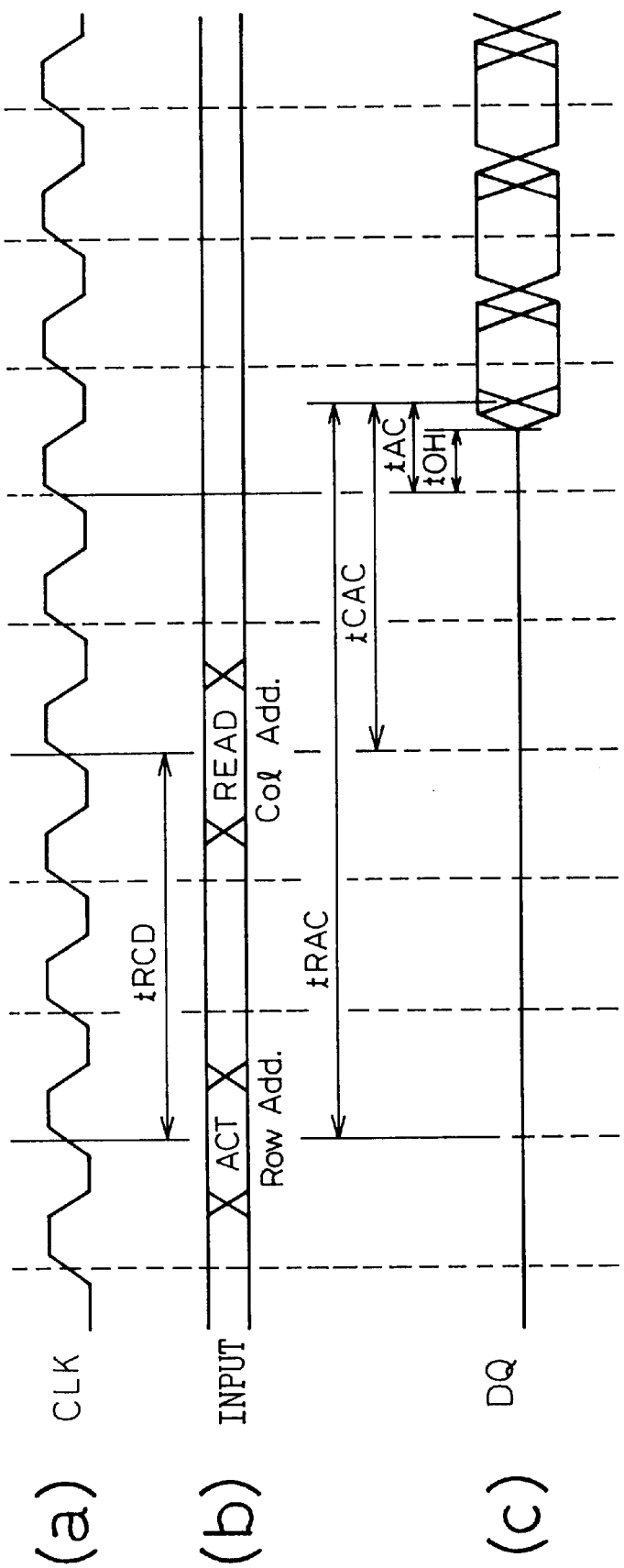
FIG. 7 is a timing chart for explaining the operations of the synchronous DRAM shown in FIG. 6.

FIG. 6 is a block diagram showing the outline configuration of a synchronous DRAM to which a semiconductor integrated circuit including a semiconductor device of the present invention is adapted. FIG. 7 is a timing chart for explaining the operations of the synchronous DRAM.

A semiconductor chip of the synchronous DRAM (SDRAM) shown in FIG. 6 has DRAM cores 108a and 108b, control signal latches 105a and 105b, a mode resistor 106, and column address counters 107a and 107b. The DRAM cores 108a and 108b each include a plurality of banks (for example, banks Nos. 0 and 1) used to define memory areas within the chip. The DRAM cores 108a and 108b each have a storage capacity of 2048 bits by 2048 bits. The control. signal latches 105a and 105b hold various control signals to be supplied to the DRAM cores 108a and 108b. The control signals are a row address control signal RAS, a column address control signal CAS, and a write enabling signal WE. The mode resistor 106 specifies an operation mode of the SDRAM. The column address counters 107a and 107b each count pulses to indicate a column address and access data.

Furthermore, the semiconductor chip shown in FIG. 6 has a clock buffer 101 and a DLL 109. The clock buffer 101 holds a clock (CLK) (external clock), which is used as a reference for actuating the synchronous DRAM, according to a clock enabling signal CKE. The clock CLK is then supplied to the other input circuit units and a plurality of blocks within the semiconductor chip. The DLL 109 adjusts the phase of the external clock CLK, and thus produces an internal clock that exhibits a predetermined phase relative to the external clock CLK. Furthermore, the semiconductor chip has a command decoder 102, an address buffer/register and bank selector 103, and an I/O data buffer/register 104. The command decoder 102 decodes various command signals and supplies resultant signals to the control signal latches 105a and 105b and mode register 106. The various command signals are a chip selection signal /CS, a row address strobe /RAS, a column address strobe /CAS, and a write enabling signal /WE. The address buffer/register and bank selector 103 holds memory address signals A0 to A10, which represent row addresses and column addresses, and a bank address signal A11. These signals are supplied to the mode register 106, column address counters 107a and 107b, and DRAM cores 108a and 108b. The I/O data buffer/register 104 holds various data items DQ (DQ0 to DQ7 and DQM) and supplies them to the I/O units in the DRAM cores. The command decoder 102 includes, typically, the command decoder unit 1, command decoder control unit 2, command signal input circuit 3, and command signal hold circuit 4 which are shown in FIG. 5 mentioned above.

Furthermore, referring to FIG. 6, any of the command signals including the chip selection signal /CS, row address strobe /RAS, column address strobe /CAS, and write enabling signal /WE are combined in order to thus input various commands. An operation mode is determined with an input command. The various commands are interpreted by the command decoder 102. The circuits are controlled according to an operation mode. On the other hand, the chip selection signal /CS, row address strobe /RAS, column address strobe /CAS, and write enabling signal /WE are also input to the control signal latches 105a and 105b. The states of existing command signals are latched until the next command is input.

Furthermore, referring to FIG. 6, the memory address signals A0 to A10 and bank address signal A11 are amplified by the address buffer/register and bank selector 103, and thus represent row addresses in each bank. Moreover, the memory address signals A0 to A10 and bank address signal A11 represent initial values to be set in the column address counters 107a and 107b. A signal read from the DRAM core 108a or 108b is amplified by the I/O data buffer/register 104, and output synchronously with the leading edge of the external clock CLK that is input externally. Input data is handled in the same way. Data input to the I/O data buffer/register 104 is written in the DRAM core 108a or 108b.

According to the timing chart shown in FIG. 7, various control signals are input (shown in a portion (b) of FIG. 7) to a DRAM core synchronously with the leading edge of the external clock CLK shown in a portion (a) of FIG. 7. Data is then read from the DRAM core. In this case, first, a row address in the memory matrix of the DRAM core is selected. In a predetermined delay time (corresponding to a delay time tRCD to be described later), a column address is selected. Data reading is then started.

To be more specific, for reading data from the SDRAM, an active (ACT) command represented by a combination of the various command signals is input through a command terminal, and a row address signal is input through an address terminal. With the input of the command and row address, the SDRAM becomes active. The SDRAM selects a word line indicated with the row address, and places information in cells lying on the selected word line on a bit line. The cell information is then amplified by a sense amplifier. On the other hand, when the time required by the components involved in accessing the row address (delay time dRCD) has elapsed, a read command (READ) and a column address are input. The selected data amplified by the sense amplifier is placed on a data bus according to the column address. Thereafter, the data is amplified by a data bus amplifier, and further amplified in an output buffer. Eventually, data DQ is output through an output terminal (portion (c) of FIG. 7).

The series of actions is identical to that of a general-purpose DRAM. In the case of the SDRAM, the circuits involved in accessing a column address are pipelined. Read data items that have been read out are output successively during each cycle. The cycle of data transfer is therefore equal to the cycle of the external clock CLK.

Access times required to access the SDRAM are classified into three different access times. The three access times are defined with the leading edge of the external clock CLK as a reference. In FIG. 7, tRAC denotes a row address access time that is the time required by the circuits involved in accessing a row address. tCAC denotes a column address access time that is the time required by the circuits involved in accessing a column address. tAC denotes a clock access time corresponding to a time lag that elapses from the leading edge of the external clock CLK to data output. When the SDRAM is employed in a high-speed memory system, the access times tRAC and tCAC that are the times from the instant a command is input to the instant data is output first are important. For improving the data transfer rate, the clock access time tAC is important alike.

In FIG. 7, tOH denotes an output data hold time between the previous cycle to the next cycle. When a difference in characteristics of an SDRAM from another, and the temperature dependency and supply voltage dependency thereof are taken into account, the access times tAC and tOH disagree with each other. There is a certain time difference between the access times. During the time equivalent to the time difference, data to be output through the output terminal is undetermined. The time during which data is uncertain, that is, the data undetermined time means the time during which it is unpredictable what kind of data is output. The memory system cannot be used during the time.

The data undetermined time tends to vary with a difference in characteristics of an SRAM from another or a change in temperature or supply voltage. For outputting data without an error according to accurate timing even in this situation, it is required that the data should be output at a predetermined phase relative to the external clock CLK. In other words, the clock access time tAC must be constant. For example, it may be preferred that output of data is performed synchronously with the leading edge of an internal clock. In this case, a magnitude of delay caused by a variable delay circuit in the DLL 109 must be set so that a phase difference between the external clock CLK and internal clock will be retained at a value equivalent to a predetermined cycle, for example, 360° (0°).

Figure 8:
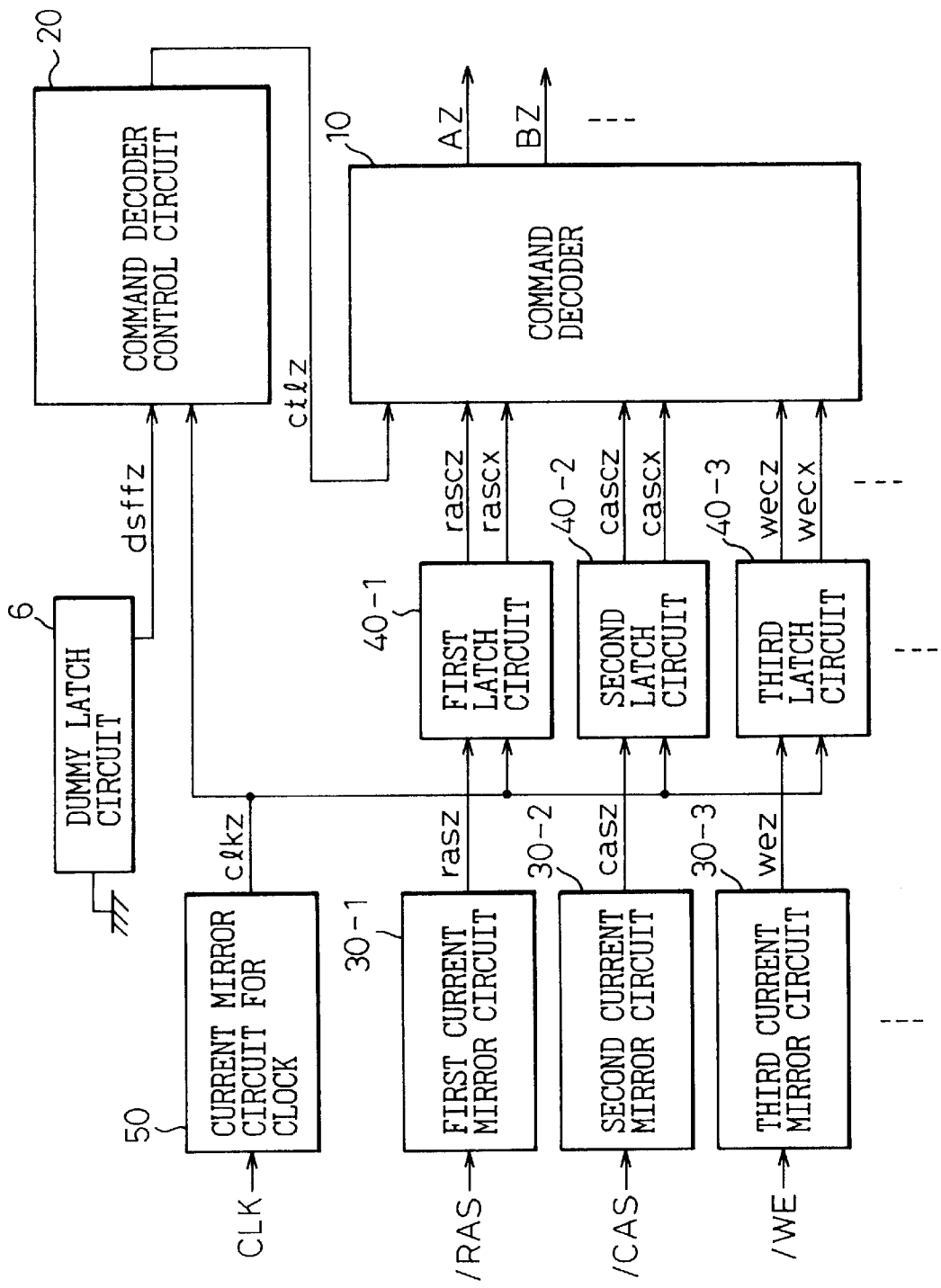
FIG. 8 is a circuit block diagram showing the outline configuration of the first embodiment of the present invention.

FIG. 8 is a circuit block diagram showing the outline configuration of the first preferred embodiment of the present invention. The same reference numerals will be assigned to components identical to those described previously.

Figure 3:
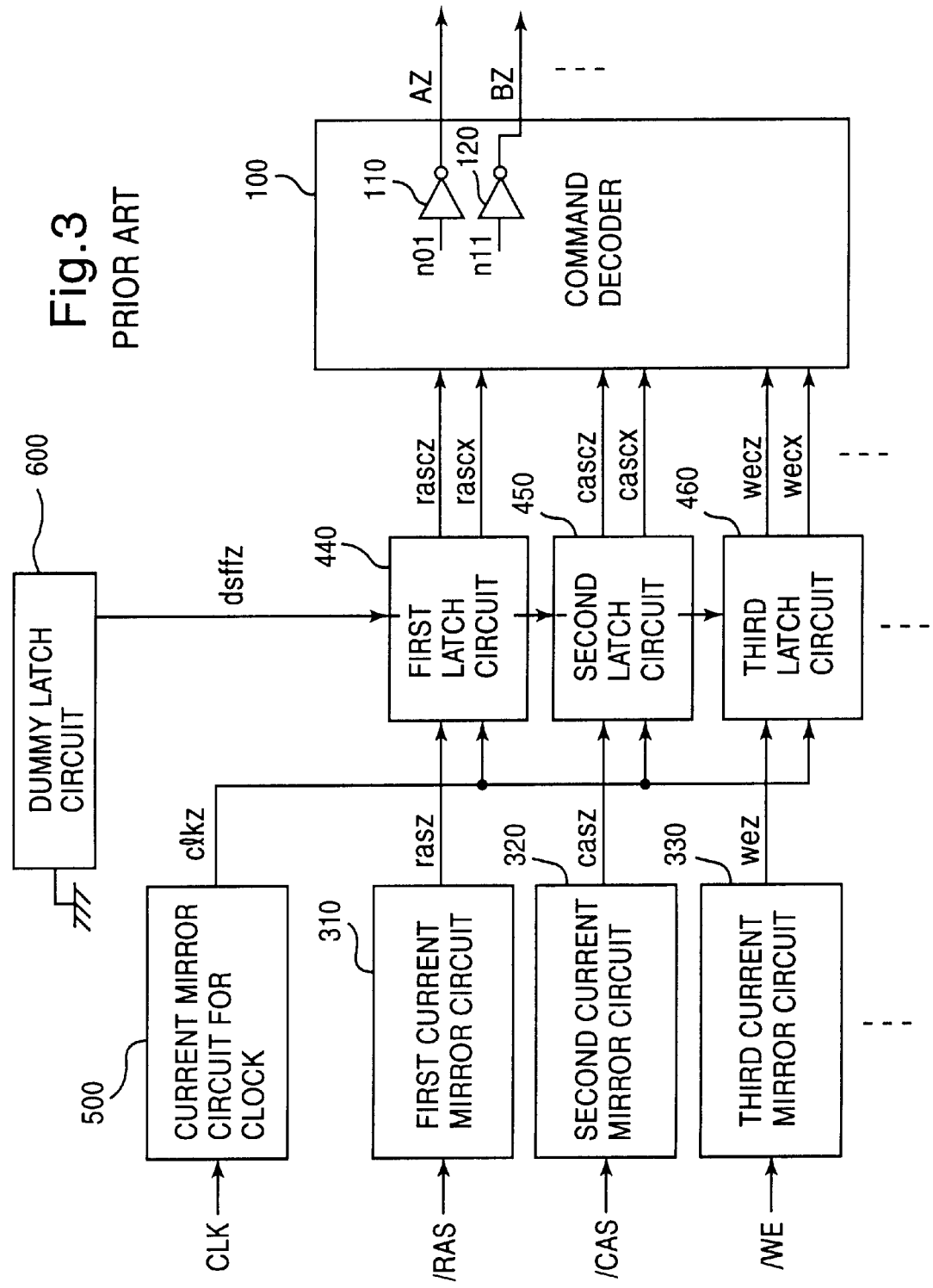
FIG. 3 is a circuit block diagram showing the outline configuration of a semiconductor device of the second example of conventional semiconductor devices having the function of judging the states of command signals.

In short, the first preferred embodiment shown in FIG. 8 is realized by installing a command decoder control circuit 20 on the input stage of the command decoder of the conventional semiconductor device of the second example (See FIG. 3). The command decoder control circuit 20 has the capability of the command decoder control unit 2 in accordance with the present invention (See FIG. 5). The command decoder control circuit 20 supplies a command decoder control signal ctlz, which is produced based on an internal clock clkz (corresponding to the internal clock CLK1 in FIG. 5), to the command decoder. The timing of the command decoder control signal ctlz precedes the timing of the command decoder judging the states of various command signals. The command decoder control signal ctlz is used to inactivate the command decoder.

To be more specific, referring to FIG. 8, a first current mirror circuit 30-1, second current mirror circuit 30-2, and third current mirror circuit 30-3 are included, as a concrete example of the command signal input circuit 3 shown in FIG. 5. The first current mirror circuit 30-1, second current mirror circuit 30-2, and third current mirror circuit 30-3 amplify various command signals input through external control pins to predetermined levels, and determine the output levels of the command signals. The command signals are, for example, a row address strobe /RAS, column address strobe /CAS, and write enabling signal /WE. The first to third current mirror circuits 30-1 to 30-3 have substantially the same functions as the conventional first to third current mirror circuits 310 to 330 (See, for example, FIG. 3). The first to third current mirror circuits 30-1 to 30-3 amplify the row address strobe /RAS, column address strobe /CAS, and write enabling signal /WE, and produce "H" level or "L" level command determination signals rasz, casz, and wez respectively.

Furthermore, referring to FIG. 8, a first latch circuit 40-1, second latch circuit 40-2, and third latch circuit 40-3 are included on behalf of the command signal hold circuit 4 shown in FIG. 5. The first latch circuit 40-1, second latch circuit 40-2, and third latch circuit 40-3 hold the command determination signals rasz, casz, and wez sent from the first to third current mirror circuits 30-1 to 30-3. The first to third latch circuits 40-1 to 40-3 are, similarly to the conventional first to third latch circuits 440 to 460 (See, for example, FIG. 3), each realized with a set-reset flip-flop (SFF). The first to third latch circuits 40-1 to 40-3 latch the command determination signals rasz, casz, and wez synchronously with the internal clock clkz output from a current mirror circuit 50 for a clock. The first to third latch circuits 40-1 to 40-3 output command information latch signals rascz, cascz, and wecz that are in phase with the input command determination signals. The first to third latch circuits 40-1 to 40-3 also output command information latch signals rascx, cascx, and wecx that are out of phase with the command determination signals. The current mirror circuit 50 for a clock functions, almost as the conventional current mirror circuit 500 for a clock, as an input buffer used to convert the level of the external clock CLK and produce the internal clock clkz.

Referring to FIG. 8, a command decoder 10 is included on behalf of the command decoder 1 shown in FIG. 5. The command decoder 10 decodes command information. latch signals output from the first to third latch circuits 40-1 to 40-3. The command decoder 10 then judges the states of the command signals including the row address strobe /RAS, command address strobe /CAS, and write enabling signal /WE. The command information signals are latched by the first to third latch circuits 40-1 to 40-3 while being synchronous with the internal clock clkz. The command decoder 10 judges from the command information signals the states of the command signals indicating what operation the SDRAM or the like should make. The results of judgment made on the states of the command signals by the command decoder 10 are output in the form of "H" level or "L" level clocked judgment signal AZ or BZ. The configuration of the command decoder 10 is nearly identical to that of the conventional command decoder 100 (See FIG. 3). A difference from the conventional command decoder 100 lies in that the command decoder control signal ctlz is supplied from the command decoder control circuit 20.

Furthermore, referring to FIG. 8, a dummy latch circuit 6 is installed on the input stage of the command decoder control circuit 20. The dummy latch circuit 6 has substantially the same configuration as the conventional dummy latch circuit 600 (See FIG. 3), but has a function different from the conventional latch circuit. Specifically, the dummy latch circuit 6 shown in FIG. 8 monitors a latch circuit that acts last among the plurality of latch circuits for holding the states of various command signals. The plurality of latch circuits are, for example, the first to third latch circuits 40-1 to 40-3. The dummy latch circuit 6 produces a dummy latch signal dsffz according to the timing of the latch circuit acting last, and supplies the dummy latch signal dsffz to the command decoder control circuit 20.

According to the first preferred embodiment shown in FIG. 8, as mentioned previously, the newly included command decoder control circuit 20 produces a control signal such as a command decoder control signal ctlz. The timing of the command decoder control signal precedes the timing of the command decoder 10 judging the states of various command signals. The command decoder control signal ctlz is input to the command decoder 10, whereby the command decoder 10 is inactivated. The control signal is preferably produced by a DLL having the function of outputting a clock that leads the internal clock clkz, for example, a clock synchronous with the external clock CLK. Consequently, a margin in timing of actuating the semiconductor device can be expanded.

In short, the command decoder control circuit 20 and command decoder 10 in the first preferred embodiment acts according to a flow described below. Consequently, occurrence of multi-signal selection due to a skew between command signals can be prevented perfectly. A semiconductor device enjoying a high processing speed can be realized. The processing flow includes the following steps:

(1) The command decoder control circuit resets and inactivates the command decoder by supplying a signal whose transmission rate is higher than that of signals input through control pins and latched by the first to third latch circuits. The signal is, for example, the command decoder control signal cltz.

(2) Meanwhile, the command signals input through the control pins are latched by the first to third latch circuits.

(3) The command decoder is inactivated temporarily with the command decoder control signal cltz, and then activated with a dummy latch signal dsffz or the like. The command decoder judges the states of the command signals latched by the first to third latch circuits, and issues a clocked judgment signal associated with the states of the various command signals through a command pin.

Next, a description will be made concerning the practical configuration of each circuit in the first preferred embodiment shown in FIG. 8. The circuitry other than the command decoder control circuit 20 and command decoder 10 in FIG. 8 is substantially identical to the conventional one. The circuitry will therefore be described briefly.

Figure 9:
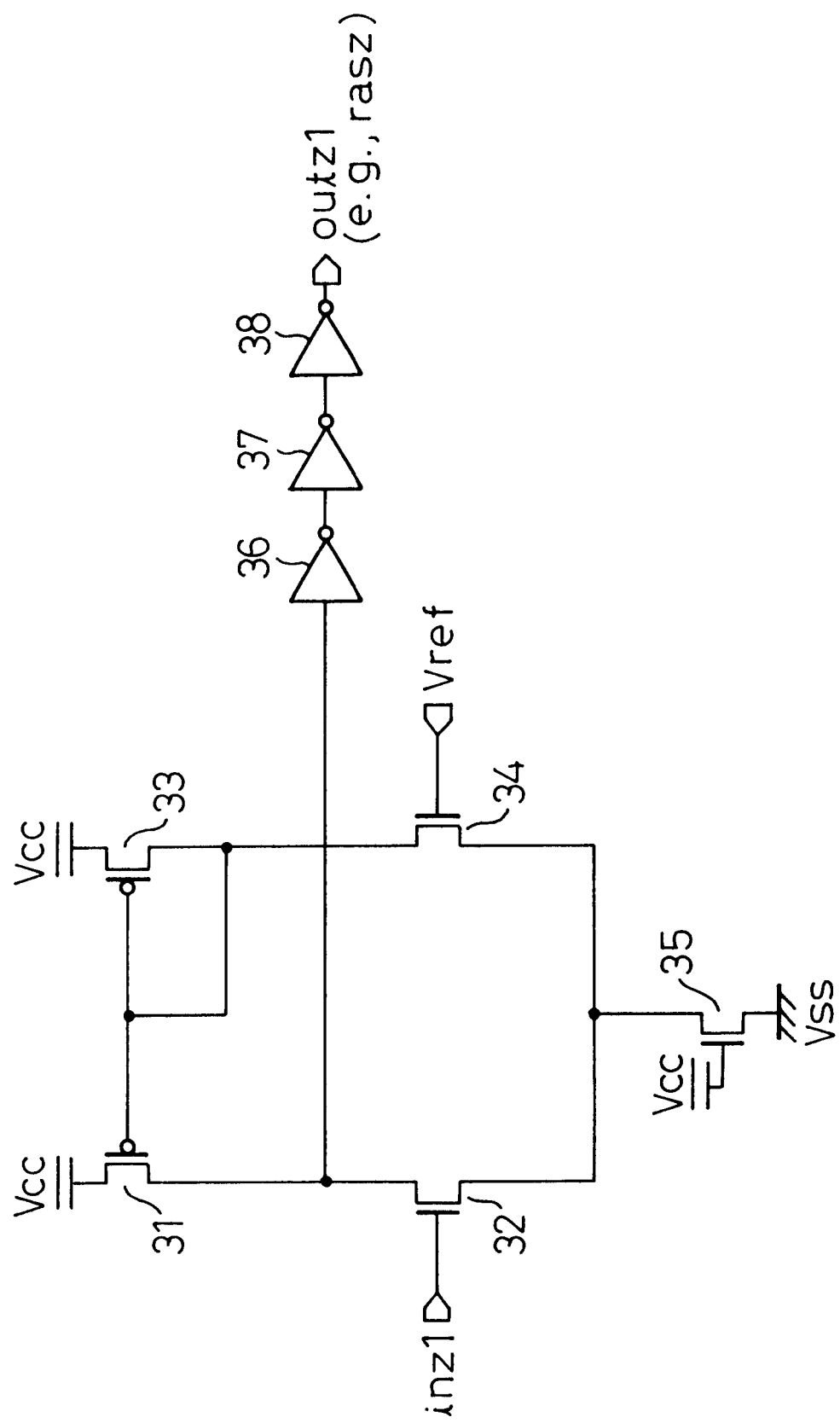
FIG. 9 is a circuit diagram showing the practical configuration of a current mirror circuit shown in FIG. 8.

FIG. 9 is a circuit diagram showing the practical configuration of a current mirror circuit shown in FIG. 8. The first to third current mirror circuits 30-1 to 30-3 shown in FIG. 8 have the same circuitry. Herein, the practical circuitry of one current mirror circuit will be described as representative.

The current mirror circuit shown in FIG. 9 has a differential amplifier composed mainly of a pair of NMOS transistors 32 and 34. One of the NMOS transistors 32 has the drain thereof connected to a high-voltage power supply (for example, a power supply Vcc of a high voltage) via a PMOS transistor 31. The source of the NMOS transistor 32 is connected to a low-voltage power supply (for example, a ground-level power supply Vss) via an NMOS transistor 35. On the other hand, the drain of the other NMOS transistor 34 is connected to the high-voltage power supply via a PMOS transistor 33. The source of the NMOS transistor 34 is connected to the low-voltage power supply via the NMOS transistor 35.

Referring to FIG. 9, the output level for an input signal inzl ("H" level or "L" level) is determined by converting the level of an input signal inzl according to a reference voltage Vref. The reference voltage Vref is input to the gate of the other NMOS transistor 34. The input signal inzl (for example, a command signal such as a row address strobe /RAS, column address strobe /CAS, or write enabling signal /WE) is input to the gate of the NMOS transistor 32. The signal whose output level is thus finalized is output as an output signal outz1 (for example, a command determination signal rasz) via three inverters 36 to 38.

Figure 10:
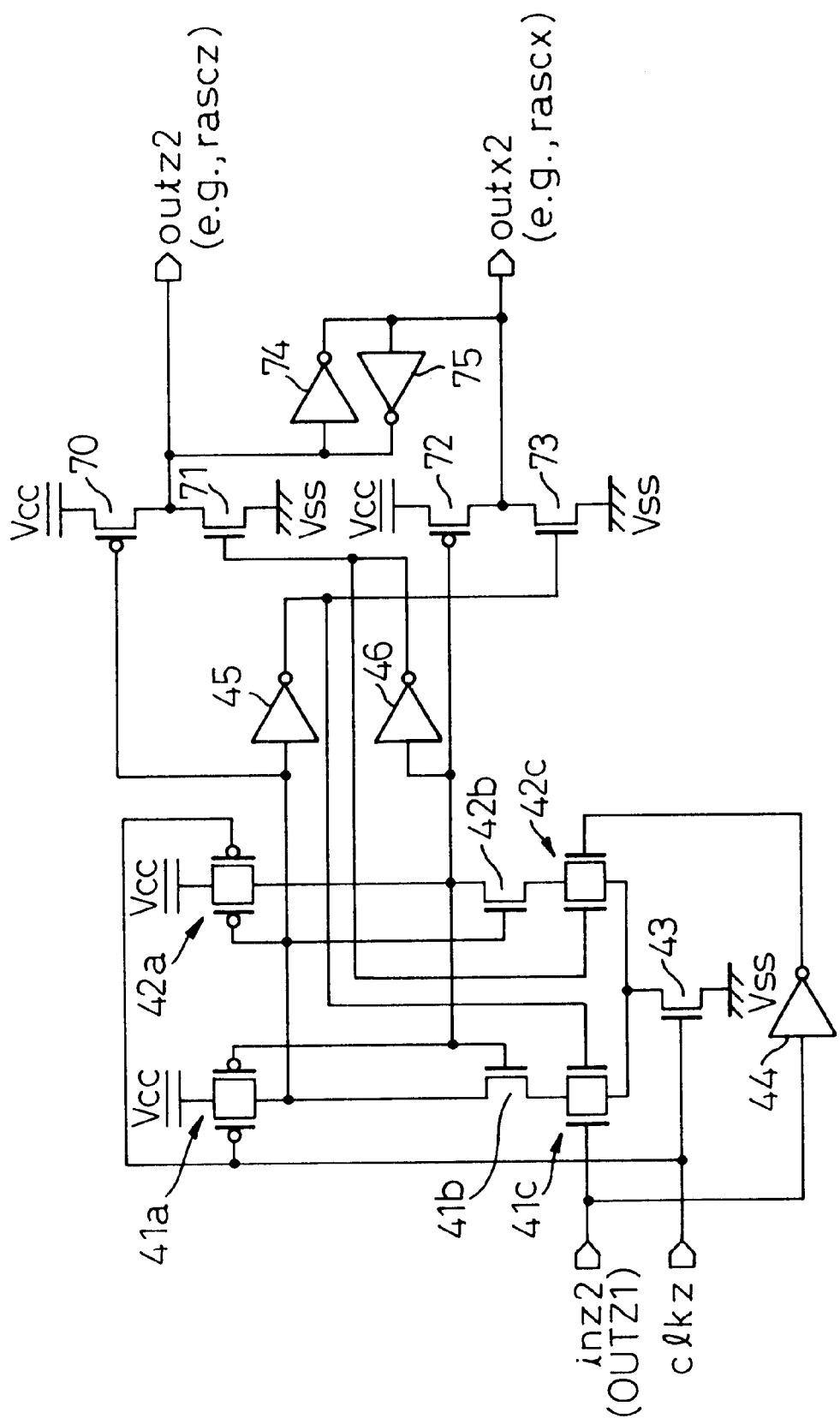
FIG. 10 is a circuit diagram showing the practical configuration of a latch circuit shown in FIG. 8.

FIG. 10 is a circuit diagram showing the practical configuration of a latch circuit shown in FIG. 8. The first to third latch circuits 40-1 to 40-3 shown in FIG. 8 have the same circuitry. Herein, the practical circuitry of one latch circuit will be shown as representative.

The latch circuit shown in FIG. 10 has a pair of NMOS transistors 41c constituting a differential amplifier, and a pair of NMOS transistors 42c. Input information (for example, an input signal inz2, that is, the output signal outz1 of a current mirror circuit) is input to the NMOS transistors 41c and 42c.

The latch circuit shown in FIG. 10 further includes input information latching NMOS transistors 41b and 42b, a pair of input information latching PMOS transistors 41a, and a pair of input information latching PMOS transistors 42a. These transistors constitute a latch unit for latching the input information (for example, the high or low-level state of the input signal inz2) synchronously with the internal clock clkz.

In the foregoing latch circuit, a difference in level of input information is given by the NMOS transistors 41c and 42c. A difference in current is provided by the input information latching NMOS transistors 41b and 42b. Thus, the input information is latched. In other words, the latch circuit forms a set-reset flip-flop (SFF) composed mainly of the NMOS transistors 41c and 42c, and the input information latching transistors 41b and 42b.

Referring to FIG. 10, the drain of the input information latching NMOS transistor 41b is connected to the high-voltage power supply via the pair of input information latching PMOS transistors 41a. The drain thereof is also connected to the gate of the other input information latching NMOS transistor 42b. On the other hand, the drain of the other NMOS transistor 42b is connected to the high-voltage power supply via the pair of input information latching PMOS transistors 42a. The drain thereof is also connected to the gate of the input information latching NMOS transistor 41b. Furthermore, the sources of the two input information latching transistors 41b and 42b are connected to the drain of an NMOS transistor 43 via the pair of NMOS transistors 41c and the pair of NMOS transistors 42c. The source of the NMOS transistor 43 is connected to the low-voltage power supply.

To be more specific, the input signal inz2 in phase with the output signal outz1 (for example, the command finalization signal rasz) of a current mirror circuit is input to the pair of NMOS transistors 41c. An input signal inz2 out of phase with the output signal outz1 is input to the pair of NMOS transistors 42c via an inverter 44. Furthermore, an internal clock clkz for attaining synchronism with the input signal inz2 is input to the gate of the NMOS transistor 43. Owing to this circuitry, the input signal inz2 (that is, command information) is latched while synchronized with the internal clock clkz. The latch signals that are out of phase and in phase with a command signal are output through the drains of the two input information latching NMOS transistors 41b and 42b.

Furthermore, referring to FIG. 10, the latch signal applied to the input information latching NMOS transistor 41b (signal out of phase with a command signal) passes through a latch signal buffering inverter 45, and a latch signal driving inverter. The latch signal driving inverter is composed of a PMOS transistor 72 and NMOS transistor 73. The latch signal is then output as an output signal outx2 that is out of phase with a command signal (for example, a command latch information latch signal rascx). The latch signal applied to the other input information latching NMOS transistor 42b passes through a latch signal buffering inverter 46 and a latch signal driving inverter. The latch signal driving inverter is composed of a PMOS transistor 70 and an NMOS transistor 71. The latch signal is output as an output signal outz2 in phase with a command signal (for example, a command information latch signal rascz). Nodes at which the command information latch signals rascz and rascx are developed are interconnected via output signal latching inverters 74 and 75 of opposite polarities connected in parallel with each other.

Figure 11:
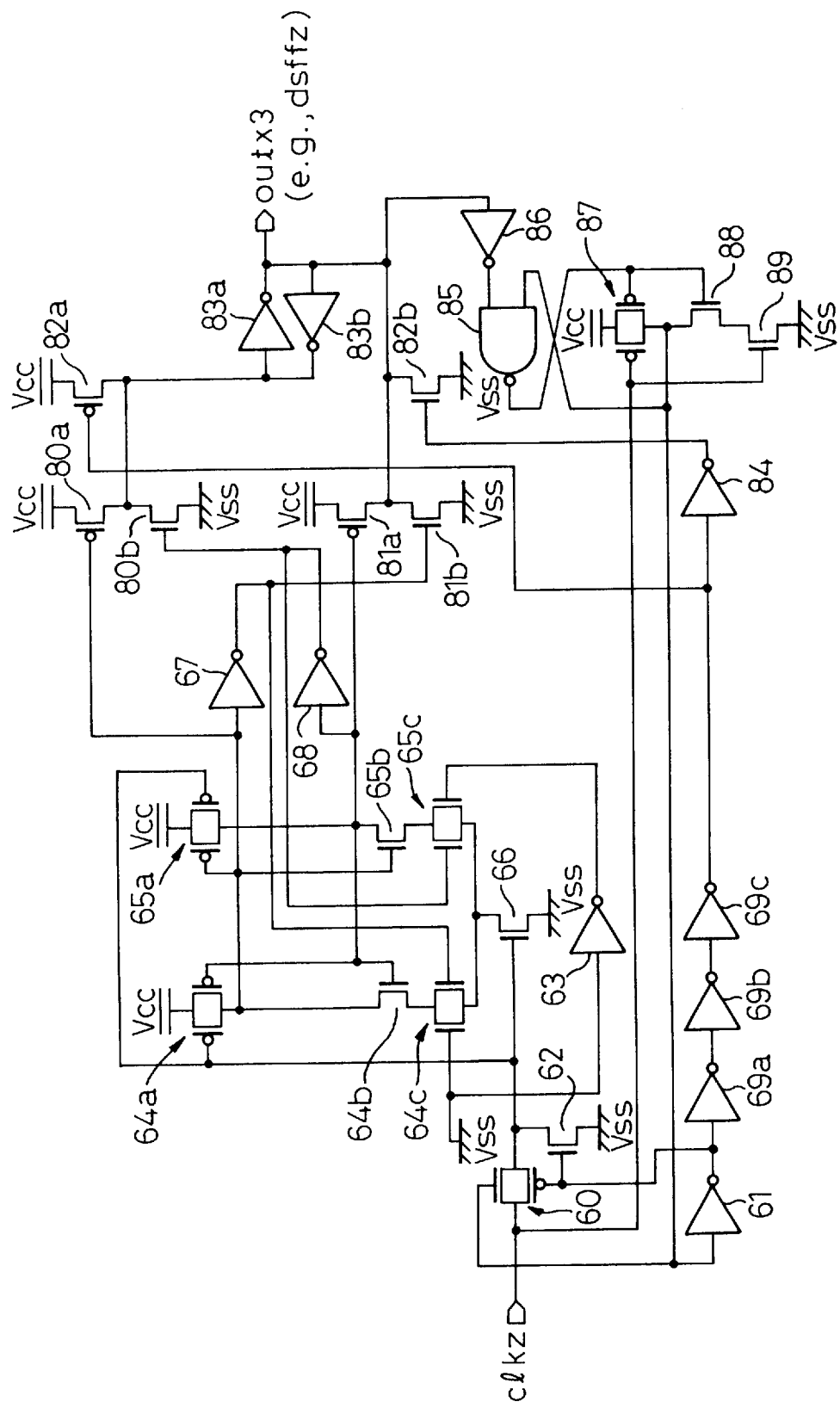
FIG. 11 is a circuit diagram showing the practical configuration of a dummy latch circuit shown in FIG. 8.

FIG. 11 is a circuit diagram showing the practical configuration of the dummy latch circuit shown in FIG. 8. The dummy latch circuit fixes a node, to which an input signal provided by a normally employed latch circuit like the one shown in FIG. 10 is input, at "L" level (that is, the ground level). Thus, the dummy latch circuit 6 outputs a pulsed signal.

Referring to FIG. 11, an SFF is composed mainly of a pair of NMOS transistors 64c, a pair of NMOS transistors 65c, and dummy latch NMOS transistors 64b and 65b. The pair of NMOS transistors 64c latches "L" level input signal synchronously with the internal clock clkz.

To be more specific, the SFF in FIG. 11 includes, similarly to the one shown in FIG. 10, dummy latch NMOS transistors 64b and 65b, a pair of POMS transistors 64a, a pair of PMOS transistors 65a, a pair of NMOS transistors 64c, and a pair of NMOS transistors 65c, an internal clock inputting NMOS transistor 66, and an inverter 63. In the SFF shown in FIG. 11, "L" level input signal is input to the pair of NMOS transistors 64c. At this time, "H" level signal synchronous with the internal clock clkz is output through the drain of the dummy latching NMOS transistor 64b. on the other hand, "H" level input signal is input to the pair of NMOS transistors 65c. An "L" level signal synchronous with the internal clock clkz is then output through the drain of the other dummy latching NMOS transistor 65b.

Furthermore, referring to FIG. 11, a dummy latch signal sent from the dummy latching NMOS transistor 64b passes through a dummy latch signal buffering inverter 67 and a dummy latch signal driving inverter. The dummy latch signal driving inverter consists of a PMOS transistor 81a and NMOS transistor 81b. The dummy latch signal is then output as a pulsating signal of positive polarity (output signal outz3 such as a dummy latch signal dsffz) through the drain of a pulse signal generating NMOS transistor 82b. In this case, the internal clock clkz is latched by a transfer gate 60, an inverter 61, and an NMOS transistor 62. After being delayed by three inverters 69a to 69c, the internal clock clkz is input to the gate of the NMOS transistor 82b. Furthermore, the pulsed signal is input to one terminal of an NAND gate 85 via an inverter 86. The clock delayed by the inverters 69a to 69c is used to control the on-off operation of the NMOS transistor 82b. Thus, a pulsed signal having a predetermined pulse duration can be produced.

On the other hand, a dummy latch signal output from the other input information latching NMOS transistor 65b passes through a dummy latch signal buffering inverter 68 and a dummy latch signal driving inverter. The dummy latch signal driving inverter consists of a PMOS transistor 80a and an NMOS transistor 80b. In this case, a pulsed signal of positive polarity is provided through the drain of a PMOS transistor 82a and output signal latching inverters 83a and 83b of opposite polarities connected in parallel with each other. After being delayed by the three inverters 69a to 69c, the internal clock clkz is input to the gate of the PMOS transistor 82a via an inverter 84.

Referring to FIG. 11, the internal clock clkz is input to another terminal of the NAND gate 85. Furthermore, an output of the NAND gate 85 is latched by a pair of PMOS transistors 87 and two NMOS transistors 88 and 89. Consequently, an output signal outx3 having an appropriate pulse duration such as the dummy latch signal dsffz can be produced.

In summary, according to the first preferred embodiment of the present invention, when a signal to be input to the dummy latch circuit 6 shown in FIG. 11 is "L", the response speed of the semiconductor device is the worst. When a pulsed signal is developed at an output node of the dummy latch circuit, all the latch circuits have completed data latching without fail. From this viewpoint, each latch circuit is designed to provide an output according to the timing of the dummy latch circuit producing a pulsed signal. Consequently, the timing of the output signal of each latch circuit making a transition can be held constant.

Figure 12:
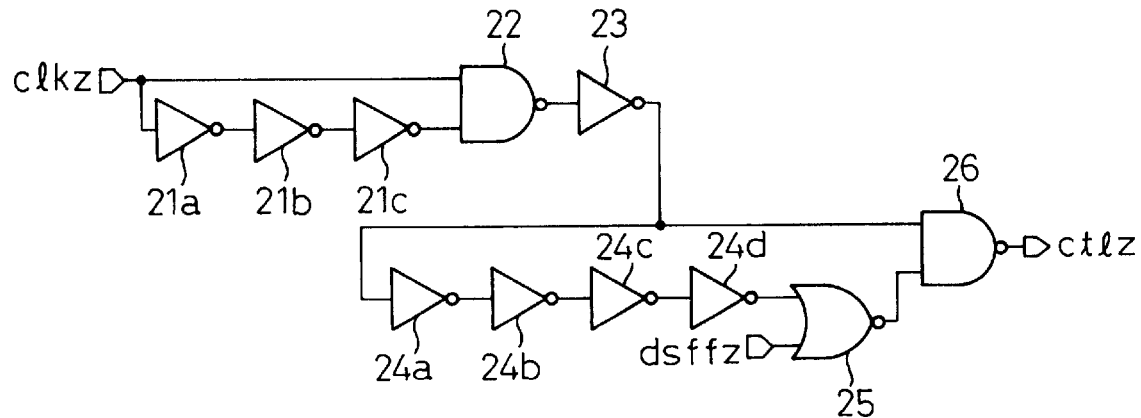
FIG. 12 is a circuit diagram showing the practical configuration of a command decoder control circuit shown in FIG. 8.

FIG. 12 is a circuit diagram showing the practical configuration of the command decoder control circuit shown in FIG. 8. The command decoder control circuit 20 shown in FIG. 12 includes three inverters 21a to 21c, a first internal signal producing NAND gate 22, and a first internal. signal outputting inverter 23. The first internal signal producing NAND gate 22 inputs the internal clock clkz, and a signal produced by delaying the internal clock clkz through the inverters 21a and 21c. The first internal signal outputting inverter 23 finalizes the level of a first internal signal produced by the first internal signal producing NAND gate 22.

Moreover, the command decoder control circuit 20 shown in FIG. 12 further includes four inverters 24a to 24d, and a second internal signal producing NOR gate 25. The second internal signal producing NOR gate 25 inputs a second internal signal such as the dummy latch signal dsffz and a signal produced by delaying the second internal signal through the inverters 24a to 24d. The command decoder control circuit 20 further includes a command decoder control signal producing NAND gate 26 for inputting the first internal signal sent from the first internal signal outputting inverter 23, and the second internal signal sent from the second internal signal producing NOR gate 25. A command decoder control signal cltz is output through a node on the output stage of the command decoder control signal production NAND gate 26, and supplied to the command decoder 10 (See FIG. 8).

Incidentally, the speed at which the internal clock clkz is transmitted after input to the command decoder control circuit 20 shown in FIG. 12 should be much higher than a speed at which the output levels of the plurality of latch circuits are determined.

Referring to FIG. 12, when the internal clock clkz makes a transition from "L" level to "H" level, a command decoder control signal cltz is driven to become "L". The command decoder control signal cltz passes through the first internal signal producing NAND gate 22 and first internal signal producing inverter 23. The command decoder control signal cltz is then output through the output terminal of the command decoder control signal producing NAND gate 26. At this time, the command decoder 10 is reset (inactivated).

Thereafter, the dummy latch signal dsffz makes a transition from "L" level to "H" level. The command decoder control signal cltz to be output through the output terminal of the command decoder control signal producing NAND gate 26 is driven to become "H". At this time, the command decoder 10 is set (activated).

In the command decoder control circuit 20 shown in FIG. 12, the command decoder control signal cltz is produced, and input to the command decoder 10 in order to inactivate the command decoder 10. The timing of the command decoder control signal cltz precedes the timing of the command decoder 10 judging the states of various command signals. Thereafter, after the states of the command signals are determined, the command decoder 10 is activated with the dummy latch signal dsffz. It can therefore be prevented that two or more command signals are selected simultaneously because of a skew between different command signals.

Figure 13:
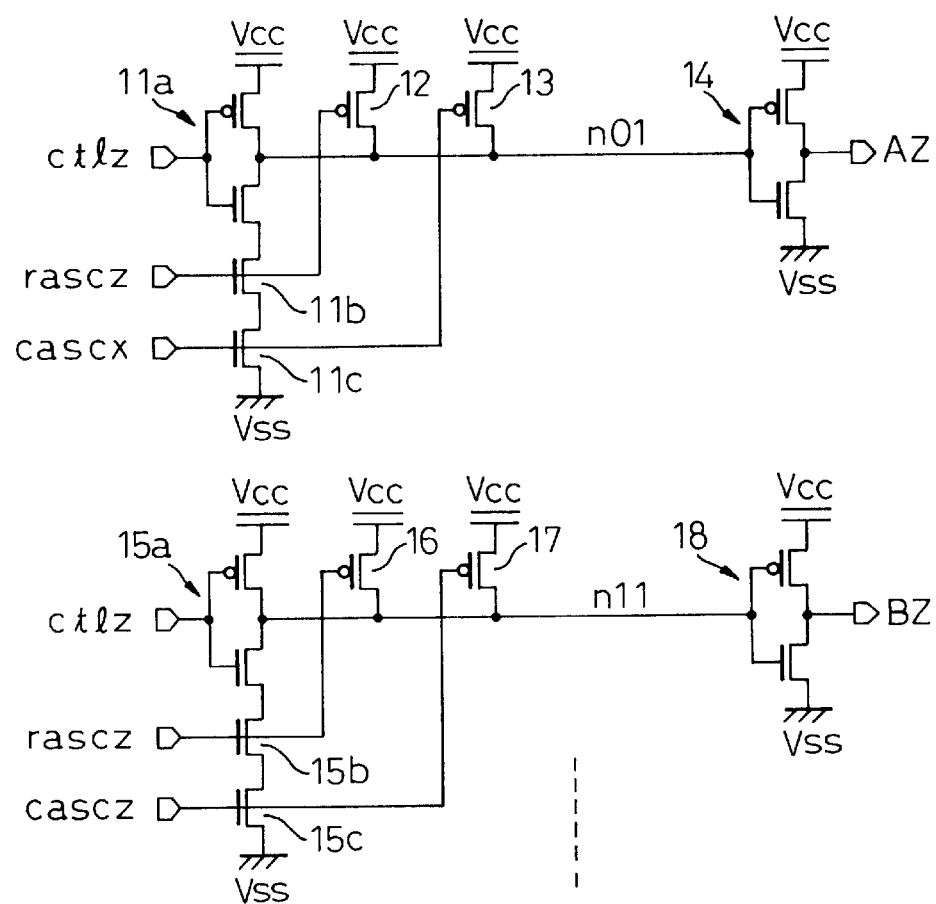
FIG. 13 is a circuit diagram showing the practical configuration of a command decoder shown in FIG. 8.

FIG. 13 is a circuit diagram showing the practical configuration of the command decoder shown in FIG. 8. The command decoder 10 shown in FIG. 13 performs decoding similarly to the conventional command decoder (See FIG. 15 to be referred to later). The command decoder 10 then judges from the command information latch signals rascz and cascz and the command information latch signals rascx and cascx what operation the SDRAM or the like should carry out. The command information latch signals rascz and cascz are latched by the first to third latch circuits 40-1 to 40-3 (See FIG. 8) (output signals outz in phase with input signals). The command information latch signals rascx and cascx are out of phase with the input signals (output signals outx out of phase with the input signals). However, the command decoder 10 shown in FIG. 13 is different from the conventional command decoder in points described below. That is to say, a logic circuit for inputting the command decoder control signal cltz is included as an input circuit of a control signal sent from the command decoder control circuit 20. Besides, the duty ratio of the semiconductor device for setting the command decoder 10 in response to the command decoder control signal cltz (duty ratio thereof for turning on an NMOS transistor) is higher.

To be more specific, the command decoder 10 shown in FIG. 13 includes an inverter 11a for inputting the command decoder control signal cltz, and NMOS transistors 11b and 11c. The inverter 11a for inputting the command decoder signal cltz consists of a PMOS transistor and an NMOS transistor connected in series with each other. The command information latch signal rascz and command information latch signal cascx are input to the NMOS transistors 11b and 11c respectively. Furthermore, the gate of a PMOS transistor 12 is connected to the gate of the NMOS transistor 11b, thus constituting an inverter. In contrast, the gate of a PMOS transistor 13 is connected to the gate of the NMOS transistor 11c, thus constituting an inverter. The inverter 11a, the inverter composed of the NMOS transistor 11b and PMOS transistor 12, and the inverter composed of the NMOS transistor 11c and PMOS transistor 13 constitute a NAND circuit. The NAND circuit receives as input signals the command decoder control signal cltz, command information latch signal rascz, and command information latch signal cascx. Furthermore, a clocked judgment signal outputting inverter 14 composed of a PMOS transistor and NMOS transistor connected in series with each other is connected to a node n01 on the output stage of the NAND circuit. The clocked judgment signal outputting inverter 14 outputs a clocked judgment signal AZ that is driven high when all the input signals are selected.

Furthermore, the command decoder 10 shown in FIG. 13 includes an inverter 15a for inputting the command decoder control signal ctlz, and NMOS transistors 15b and 15c. The inverter 15a for inputting the command decoder control signal ctlz consists of a PMOS transistor and an NMOS transistor connected in series with each other. The command information latch signal rascz and command information latch signal cascz are input to the NMOS transistors 15b and 15c, respectively. Furthermore, the gate of a PMOS transistor 16 is connected to the gate of the NMOS transistor 15b, thus constituting an inverter. In contrast, the gate of a PMOS transistor 17 is connected to the gate of the NMOS transistor 15c, thus constituting an inverter. The inverter 15a, the inverter composed of the NMOS transistor 15b and PMOS transistor 16, and the inverter composed of the NMOS transistor 15c and PMOS transistor 17 constitute a NAND circuit. The NAND circuit receives as input signals the command decoder control signal ctlz, command information latch signal rascz, and command information latch signal cascz. Furthermore, a clocked judgment signal outputting inverter 18 composed of a PMOS transistor and NMOS transistor connected in series with each other is connected to a node n11 on the output stage of the NAND circuit. The clocked judgment signal outputting inverter 18 outputs a clocked judgment signal BZ that is driven high when all the input signals are selected.

Referring to FIG. 13, before the states of all the input command information latch signals rascz, cascz, and cascx are determined, the command decoder control signal ctlz is driven to become "L". In this case, all the clocked judgment signals Az and BZ become unselected (become "L"). Furthermore, after the states of all the command information latch signals rascz, cascz, and cascx are determined, the command decoder control signal ctlz is driven to become "H", and a desired clocked judgment signal is selected (driven to become "H"). The logic circuits in the command decoder are actuated according to this timing. The command decoder 10 in FIG. 13 has no fear that multi-signal selection may occur due to a skew between different command signals. Furthermore, even if the duty cycle of the semiconductor device for setting the command decoder is made higher, no problem occurs. This results in the semiconductor device enjoying a high processing speed.

In short, the duty cycle (i.e., duty ratio) of the semiconductor device may be such that the semiconductor device exhibits a high response speed when driving an unselected transistor that is a component of a command decoder to a selected state, and exhibits a low response speed when driving a selected transistor to an unselected state. Nevertheless, it will not take place that two or more command signals are selected simultaneously due to a skew between the command signals.

Now, the practical circuitry of a latch circuit and command decoder in a conventional semiconductor device will be described briefly with reference to FIG. 14 and FIG. 15. This is intended to make clearer the difference between a semiconductor device of the present invention and a conventional semiconductor device.

Figure 14:
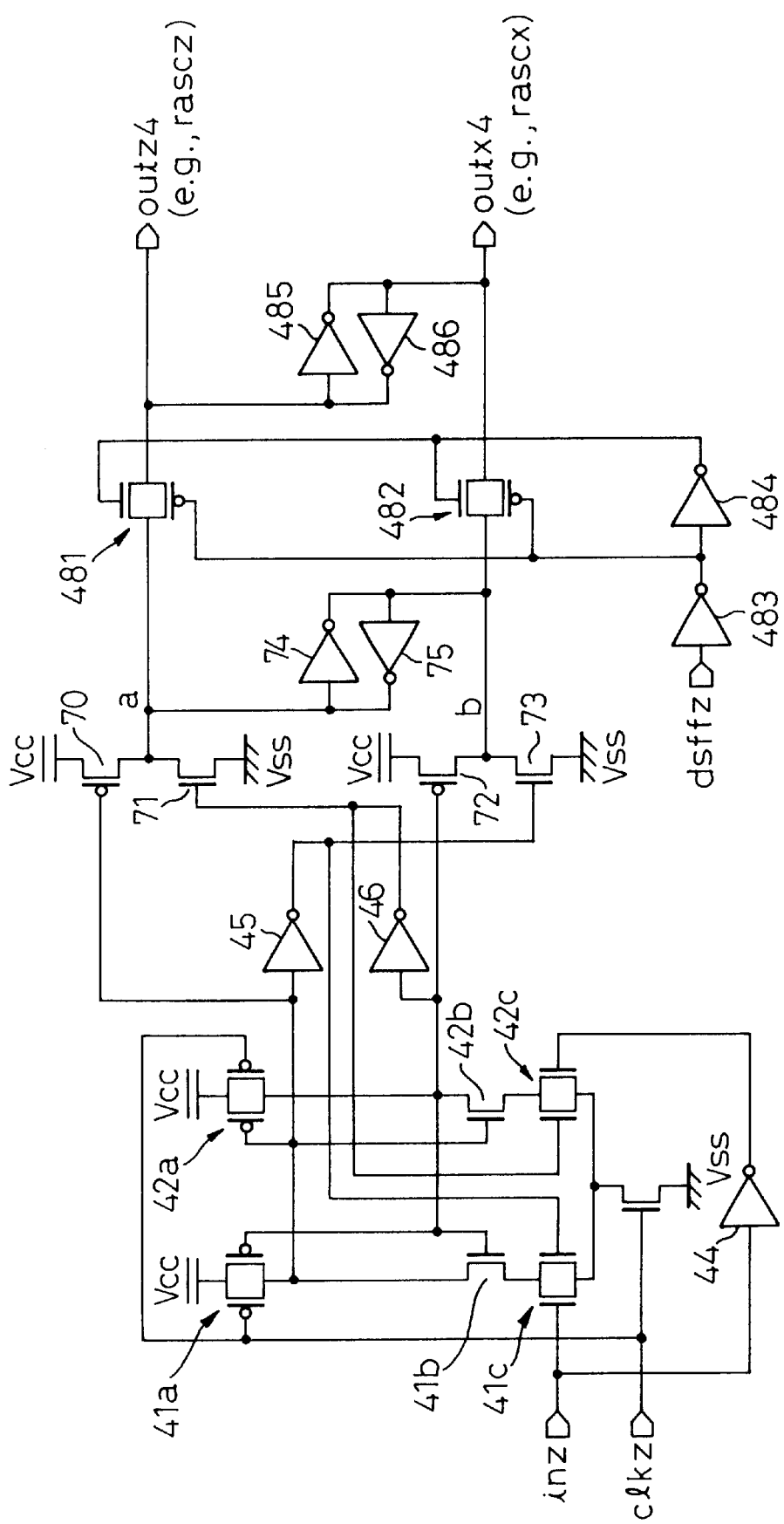
FIG. 14 is a circuit diagram showing an example of configurations for a latch circuit employed in the conventional semiconductor device of the second example.

FIG. 14 is a circuit diagram showing an example of configurations for a latch circuit employed in the conventional semiconductor device of the second example. The latch circuit shown in FIG. 14 has additionally two transfer gates 481 and 482, inverters 483 and 484, and signal latch inverters 485 and 486 connected to a node on the output stage of a latch circuit of the first example of conventional latch circuits (See, for example, FIG. 10). The circuit elements other than those circuit elements are identical to those in FIG. 10. The description of the identical circuit elements will be omitted.

In FIG. 14, a dummy latch signal dsffz sent from the dummy latch circuit is input to the input gates of the transfer gates 481 and 482 via the inverter 483. The dummy latch signal dsffz sent from the dummy latch circuit is input to the other gates of the transfer gates via the two inverters 483 and 484. The on-off operations of the transfer gates are controlled with the dummy latch signal dsffz. When the dummy latch signal dsffz is output, the states of command signals have already been latched at the output nodes a and b of the latch circuit. Assume that an operation to be made for turning on the transfer gates is one step. In this case, output signals outz4 and outx4 (for example, command information latch signals rascz, rascx, cascz, and rascx) of each latch circuit are produced in the delay time of one step. For determining the states of the output signals outz4 and outx4, signal latch inverters 485 and 486 are connected to the output terminals of the two transfer gates 481 and 482.

Figure 4:
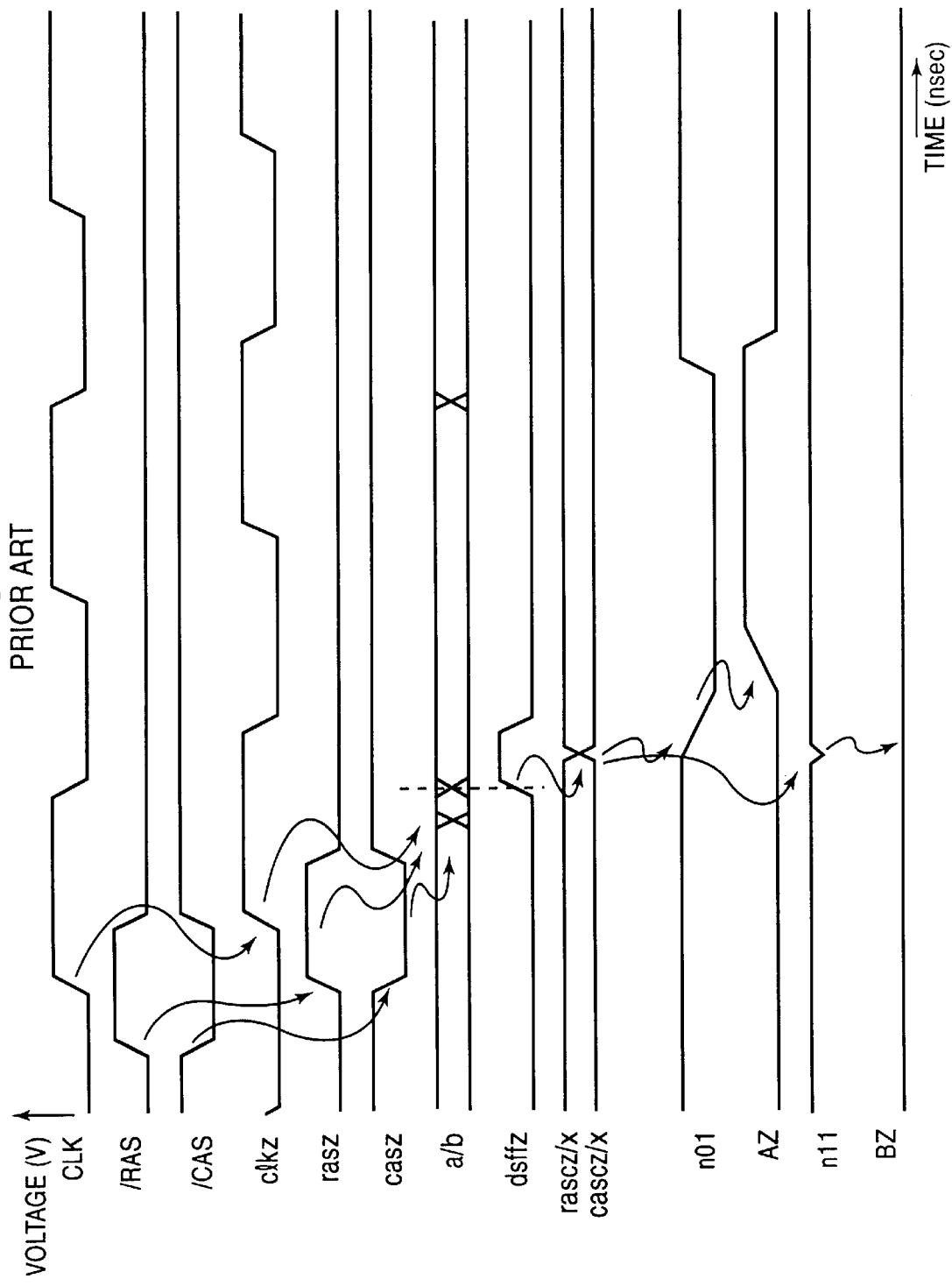
FIG. 4 is a timing chart for explaining the operations of the conventional semiconductor device of the second example shown in FIG. 3.

As described with reference to the timing chart of FIG. 4, the dummy latch signal dsffz is produced according to the timing that the logical state at either the output node a or b of a latch circuit is determined last. The time required for one step at which the transfer gates in each latch circuit are turned on with the dummy latch signal dsffz is regarded as a margin in timing of actuating the semiconductor device. The levels of output signals of each latch circuit are changed simultaneously.

Presumably, the use of the dummy latch signal dsffz will considerably reduce the risk of multi-signal selection of command signals stemming from a skew. Nevertheless, the dimensions of a command decoder must be set according to the duty ratio of the semiconductor device. The duty ratio is lowered for driving an unselected signal to a selected state, and raised for driving a selected signal to an unselected state.

Figure 15:
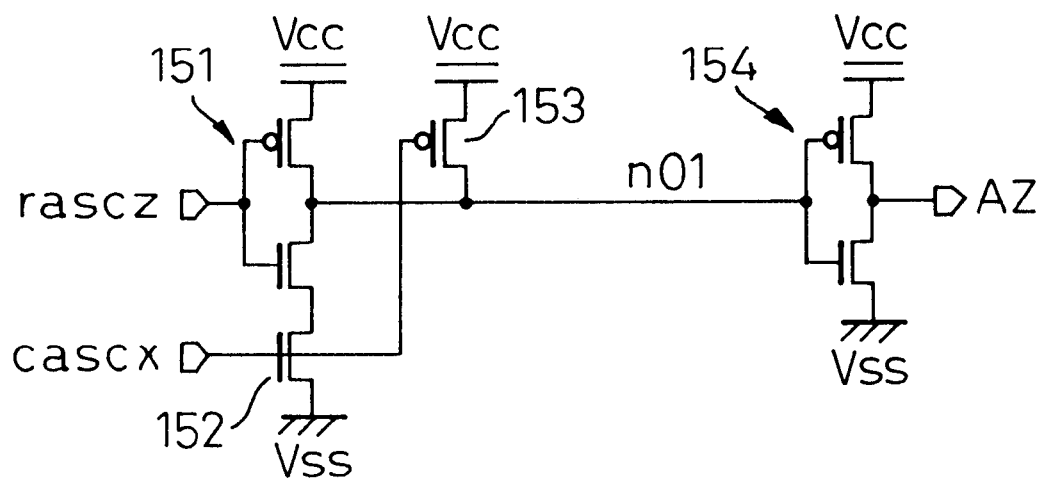
FIG. 15 is a circuit diagram showing an example of configurations for a command decoder employed in the conventional semiconductor device.
Figure 15:
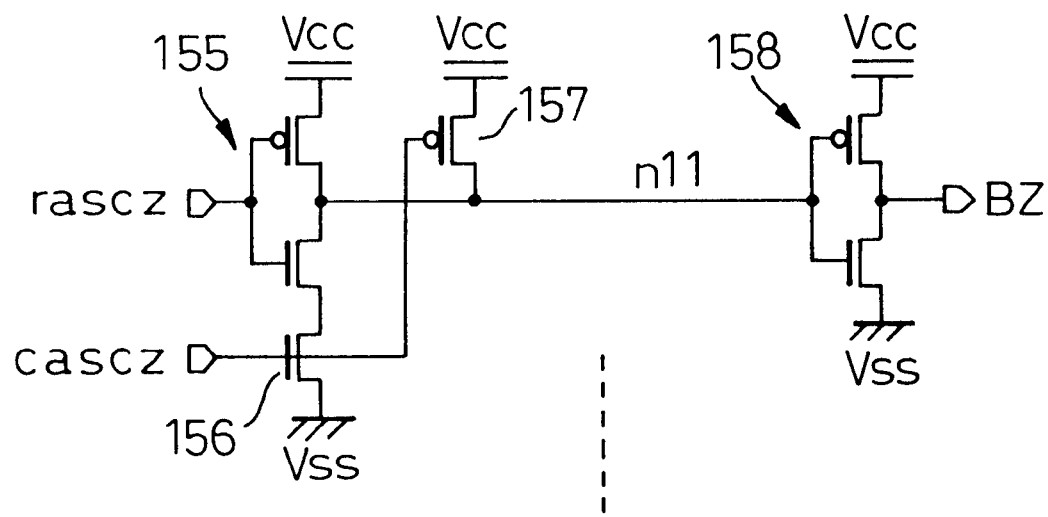

FIG. 15 is a circuit diagram showing an example of configurations for a command decoder employed in a conventional semiconductor device.

A command decoder 100 shown in FIG. 15 has an inverter 151 for inputting a command information latch signal rascz which consists of a PMOS transistor and an NMOS transistor connected in series with each other. Furthermore, the gate of an NMOS transistor 152 through which a command information latch signal cascx is input is connected to the gate of a PMOS transistor 153, whereby another inverter is realized. The inverter 151, and the inverter composed of the NMOS transistor 152 and PMOS transistor 153 constitute a NAND circuit. The NAND circuit receives as input signals the command information latch signal rascz and command information latch signal cascx. Furthermore, a clocked judgment signal outputting inverter 154 composed of a PMOS transistor and NMOS transistor connected in series with each other is connected to a node n01 on the output stage of the NAND circuit. The clocked judgment signal outputting inverter 154 outputs a clocked judgment signal AZ that is driven to become "H" when the two input signals are selected.

Furthermore, the command decoder shown in FIG. 15 has an inverter 155 for inputting the command information latch signal rascz which consists of a PMOS transistor and NMOS transistor connected in series with each other. Furthermore, the gate of an NMOS transistor 156 through which the command information latch signal cascz is input is connected to the gate of the PMOS transistor 157, whereby another inverter is realized. The inverter 155 and the inverter composed of the NMOS transistor 156 and PMOS transistor 157 constitute a NAND circuit. The NAND circuit receives as input signals the command information latch signal rascz and command information latch signal cascz. Furthermore, a clocked judgment signal outputting inverter 158 composed of a PMOS transistor and NMOS transistor connected in series with each other is connected to a node n11 on the output stage of the NAND circuit. The clocked judgment signal outputting inverter 158 outputs a clocked judgment signal BZ that is driven to become "H" when all the input signals are selected.

An attempt may be made to judge the states of command signals through the logic operations involved in simple decoding performed by the command decoder 100 having the foregoing components. In this case, there is a possibility that multi-signal selection may occur because of a skew between command signals when a selected signal is driven to an unselected state. For preventing multi-signal selection, the dimensions of the command decoder shown in FIG. 15 must be set according to the duty cycle of the semiconductor device. The duty cycle of the semiconductor device is lowered for driving an unselected signal to a selected state so that the semiconductor device will exhibit a relatively low response speed. In contrast, the duty cycle thereof is raised for driving a selected signal to the unselected state so that the semiconductor device will exhibit a relatively high response speed.

Figure 2:
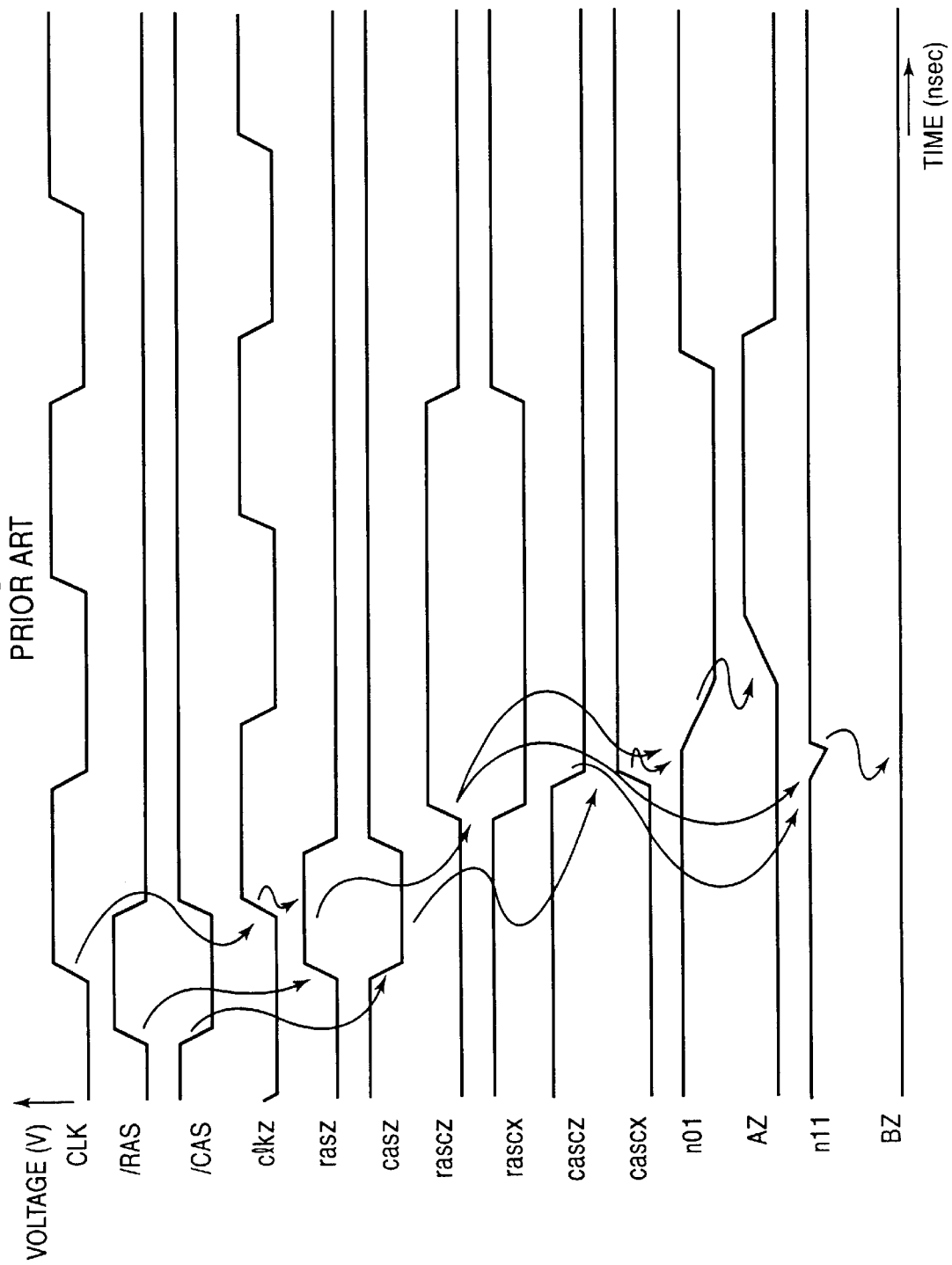
FIG. 2 is a timing chart for explaining the operations of the conventional semiconductor device of the first example shown in FIG. 1.

To be more specific, the duty cycle of the semiconductor device for driving a PMOS transistor in the NAND circuit on the initial stage of the command decoder shown in FIG. 15 is made higher than that for driving an NMOS transistor. The reverse is true of the inverter on the output stage. As apparent from the waveforms of signals shown in FIG. 2, the node n01 on the input stage of the inverter 154 (or inverter 158) on the output stage is likely to become "H". The node on the output stage of the inverter 154 (or inverter 158) is likely to become "L". Thus, the dimensions of the command decoder must be set so that the semiconductor device will exhibit a high response speed for driving a selected signal to an unselected state.

Figure 16:
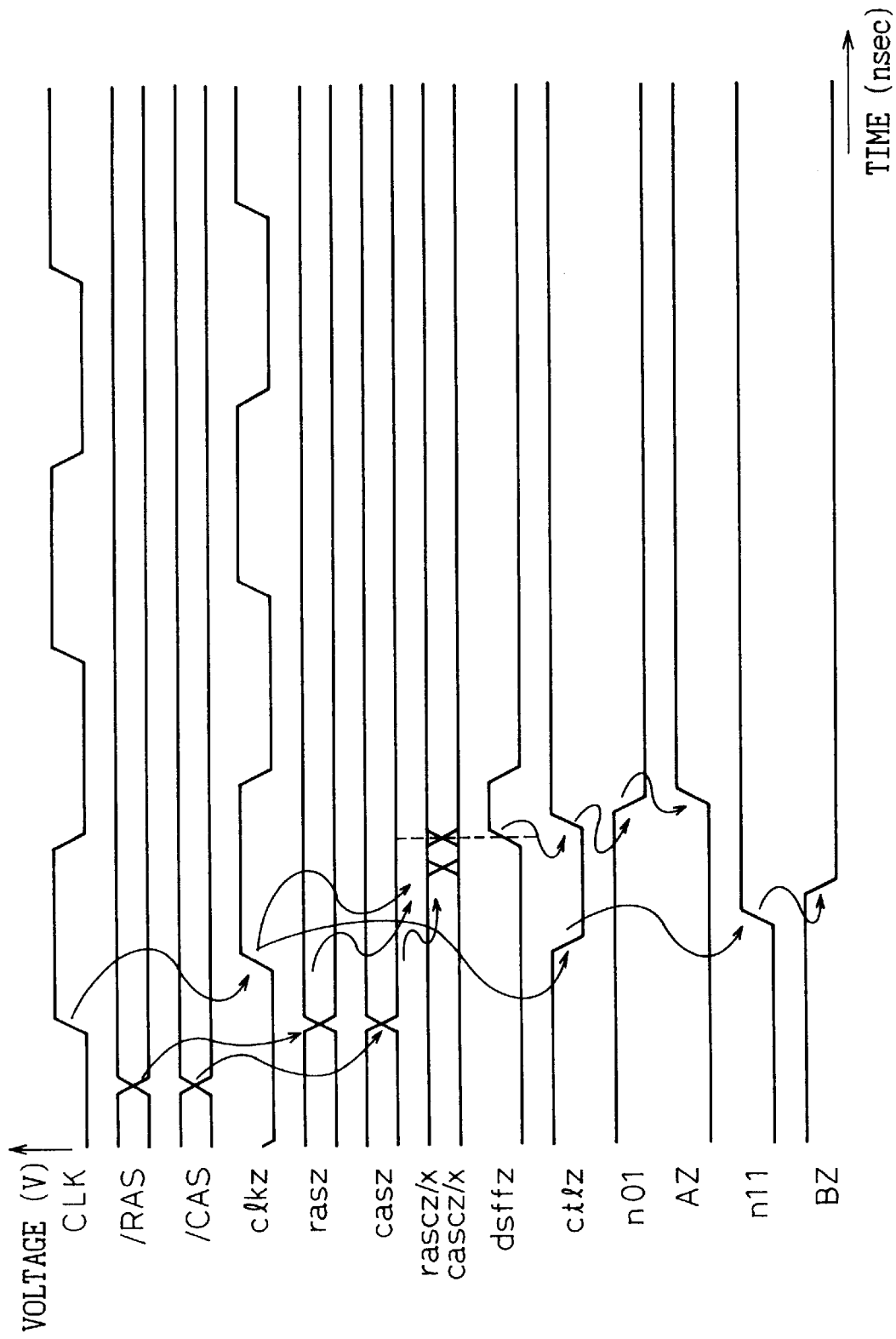
FIG. 16 is a timing chart for explaining the operations of the semiconductor device in accordance with the first embodiment of the present invention.

FIG. 16 is a timing chart for explaining operations of a semiconductor device in accordance with the first preferred embodiment of the present invention. The timing chart shown in FIG. 16 is drawn on the assumption that a clocked judgment signal BZ is selected first and a command instructing selection of another clocked judgement signal AZ is issued at that time.

Referring to FIG. 16, signals (command determination signals rasz and casz in FIG. 16) are transmitted to the output stages of the first and second current mirror circuits 30-1 and 30-2 (See FIG. 8). The signals are synchronous with and in phase with a row address strobe /RAS and column address strobe /CAS respectively which are input through external control pins. In contrast, an internal clock clkz in phase with an external clock CLK input through a clock pin is transmitted to the output stage of the current mirror circuit 50 for a clock. In this case, the command determination signals rasz and casz and the internal clock clkz make a transition from "L" level to "H" level or a transition from "H" level to "L" level substantially simultaneously.

Data (command determination signals rasz and casz) to be output from the first and second current mirror circuits 30-1 and 30-2 are determined by the first and second current mirror circuits. Thereafter, the states of the data items are latched by the first and second latch circuits 40-1 and 40-2 (See FIG. 8) synchronously with the internal clock clkz. The first and second latch circuits 40-1 and 40-2 output command information latch signals rascz and cascz as signals in phase with the command determination signals rasz and casz. The first and second latch circuits 40-1 and 40-2 output command information latch signals rascx and cascx as signals out of phase with the command determination signals rasz and casz.

As mentioned previously, according to the first preferred embodiment of the present invention, before the states of the output signals of each latch circuit are determined, the internal clock clkz is driven to become "H", and the command decoder control signal ctlz is driven to become "L". The output signals of each latch circuit are, for example, the command information latch signals rasz or casz and rascx or cascx. At this time, the clocked judgment signal BZ to be output through the node n11 becomes unselected. After the output signals of each latch circuit are determined, the dummy latch signal dsffz is driven to become "H", and the command decoder control signal ctlz is driven to become "H". At this time, the command-decoder is activated. The clocked judgment signal AZ. to be output through the node n01 is then selected. Multi-signal selection, that is, an event that two or more than two signals are selected simultaneously due to a skew between command signals can be suppressed perfectly. Furthermore, the dimensions of the command decoder need not be adjusted. This results in the semiconductor device enjoying a high processing speed. Moreover, a margin in timing of accessing the semiconductor device can be expanded.

However, for achieving the foregoing actions without an error, a signal whose timing precedes the timing of output signals of each latch circuit is needed. If each latch circuit acted at a relatively high speed, the margin in timing of actuating the semiconductor device would be insufficient as long as the internal clock clkz is used as it is.

Figure 17:
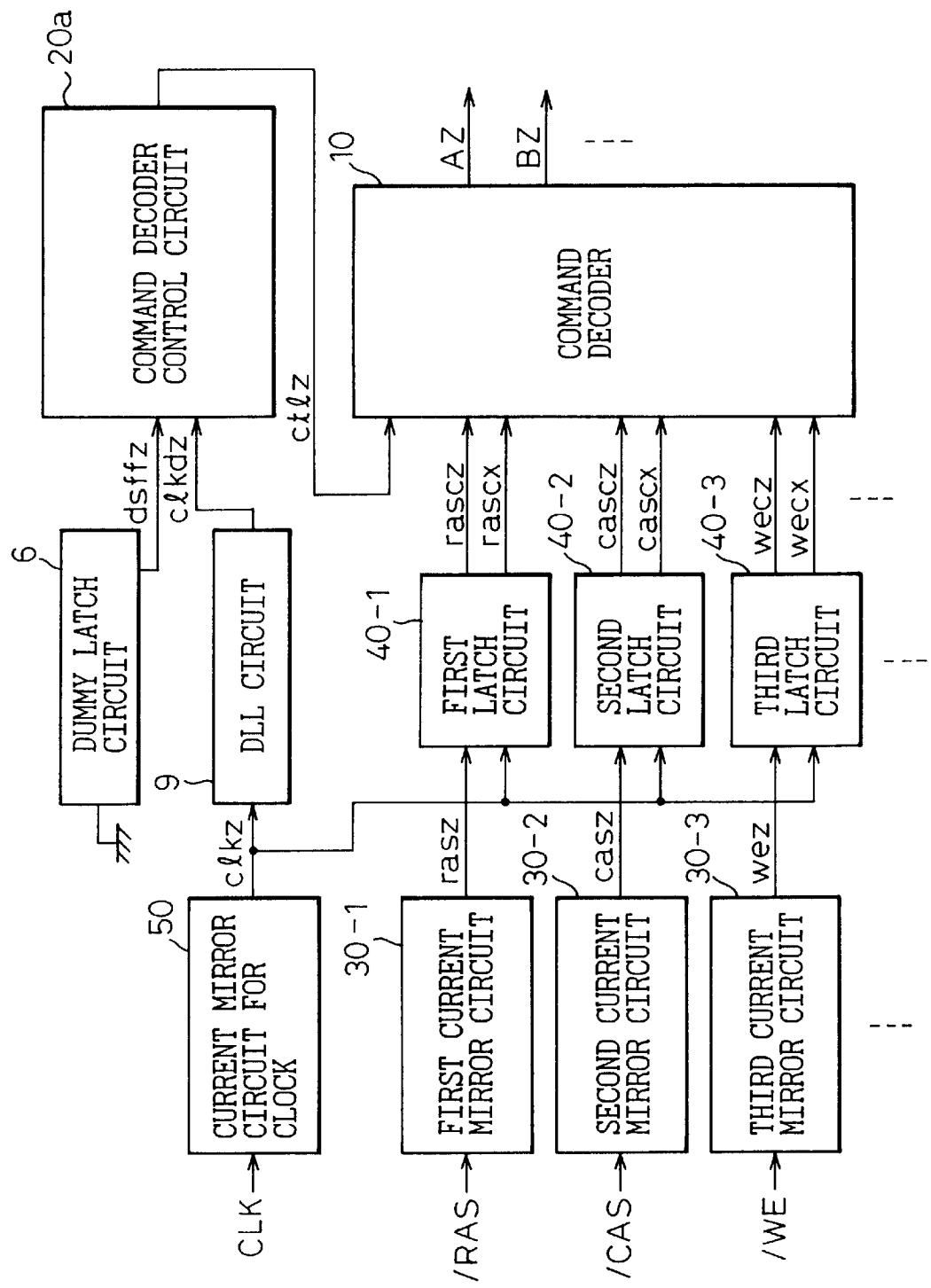
FIG. 17 is a circuit block diagram showing the configuration of the second embodiment of the present invention.

FIG. 17 is a circuit block diagram showing the configuration of the second preferred embodiment of the present invention prepared in consideration of the foregoing point. The second preferred embodiment of the present invention shown in FIG. 17 has, in addition to the components of the first preferred embodiment of the present invention shown in FIG. 8, a DLL 9.

The DLL has the function of adjusting the phase of an internal clock clk so that the internal clock will exhibit a predetermined phase (for example, 0°) relative to an external clock CLK. The adjustment is carried out so that data will be accessed at a certain phase. In other words, the DLL can produce a clock signal clkdz leading the internal clock clk. The thus produced clock signal clkdz is supplied to a command decoder control circuit 20a. Consequently, a command decoder control signal ctlz can be produced. The command decoder control signal ctlz is in phase with the external clock CLK at 0°, and exhibits timing sufficiently preceding the timing that the states of command information latch signals output from each latch circuit are determined.

Figure 18:
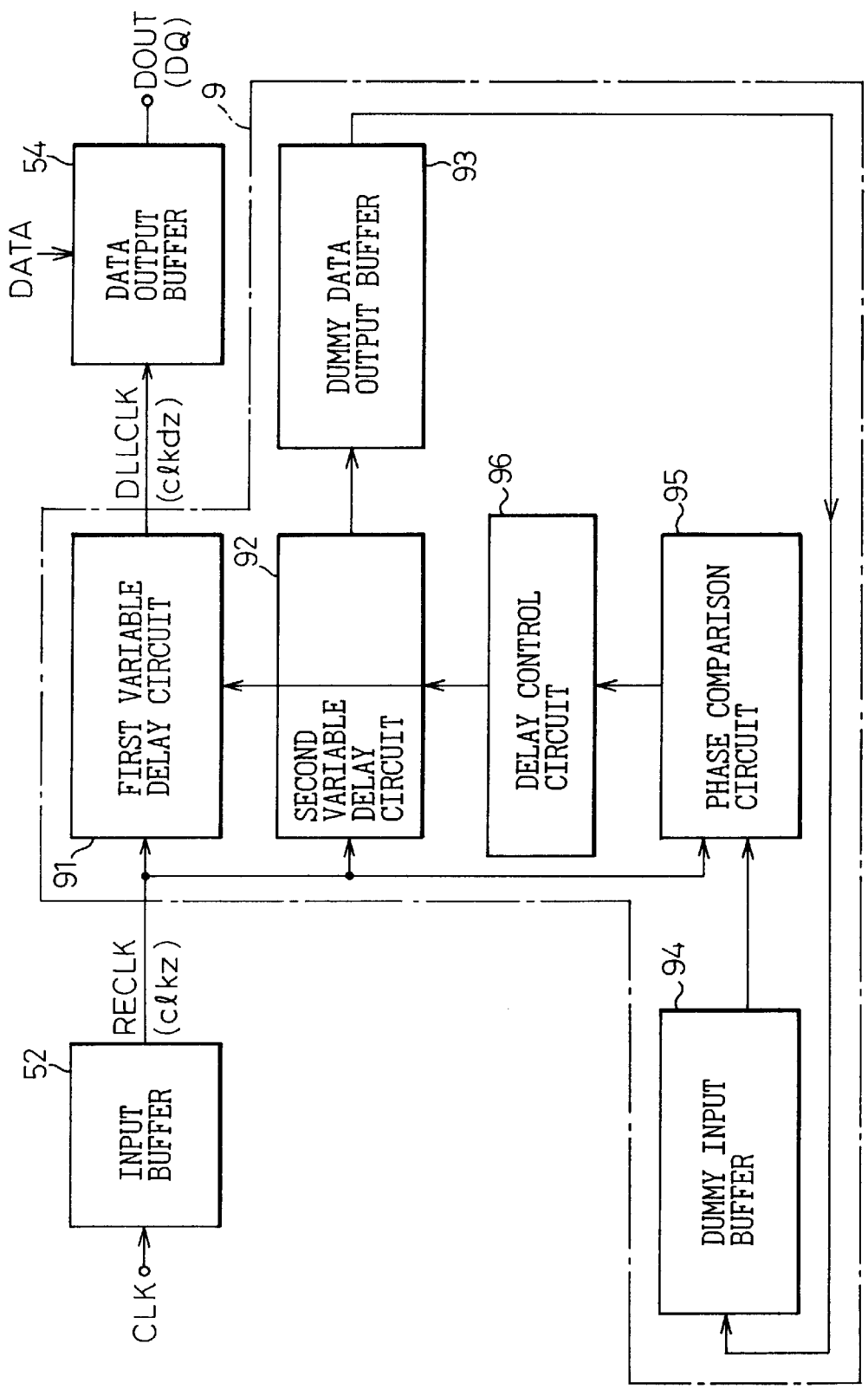
FIG. 18 is a circuit block diagram showing an example of configurations for a DLL employed in the second embodiment of the present invention.

FIG. 18 is a circuit block diagram showing an example of configurations for the DLL employed in the second preferred embodiment of the present invention. FIG. 19 is a timing chart for explaining the operations of the DLL shown in FIG. 18.

The DLL 9 shown in FIG. 18 comprises a first variable delay circuit 91 and second variable delay circuit 92, a phase comparison circuit 95, and a delay control circuit 96. The first and second variable delay circuits 91 and 92 change the magnitude of a delay to be given to the external clock to be input externally via an input buffer 52. This results in an internal clock clkz (real clock RECLK) that lags behind the external clock by a predetermined phase. The phase comparison circuit 95 compares in phase the external clock CLK with a signal input from the second variable delay circuit 92 via a dummy data output buffer 93 and dummy input buffer 94. The delay control circuit 96 specifies the magnitude of a delay to be given by the first and second variable delay circuits 91 and 92 according to the results of phase comparison performed by the phase comparison circuit 95.

To be more specific, the external clock CLK is amplified to a predetermined level in the input buffer 52. Thereafter, the external clock CLK is supplied to the first variable delay circuit 91 and second variable delay circuit 92, and also supplied as a first input signal to the phase comparison circuit 95.

The dummy input buffer 94 is included in order to cancel a phase delay of the external clock CLK, which occurs in the input buffer 52, on the input stage of the phase comparison circuit 95. Furthermore, the dummy data output buffer 93 is included in order to cancel a phase delay of the external clock CLK that occurs in a data output buffer 52. The data output buffer 52 fetches data DATA synchronously with the internal clock clkz produced. by the first variable delay circuit 91, and then outputs the data. The internal clock clkz input to the second variable delay circuit 92 is therefore supplied as a second input signal to the phase comparison circuit 95 via the dummy data output buffer 93 and dummy input buffer 94.

The phase comparison circuit 95 compares in phase the first input signal with the second input signal, and inputs the results of phase comparison between the two input signals to the delay control circuit 96. The delay control circuit 96 specifies or adjusts the magnitude of a delay to be given by the first and second variable delay circuits 91 and 92. With the adjustment, a phase difference between the external clock CLK and internal clock clkz will be set to a predetermined number of cycles, for example, one cycle (360° or 0°). Consequently, the external clock CLK input to the first variable delay circuit 91 is delayed by the magnitude of a delay adjusted by the delay control circuit 96, and then supplied to the data output buffer 54. The data output buffer 54 fetches data DATA synchronously with the clock signal clkdz (DLL clock DLLCLK) supplied from the first variable delay circuit 91, and outputs the data as an output signal OUT (DQ).

It should be noted that the delay control circuit 96 has the function of adjusting the magnitude of a delay to be given by the first and second variable delay circuits 91 and 92 in anticipation of a phase delay of the external clock CLK occurring in the data output buffer 54. At this time, the adjustment is made to advance the phase of the internal clock clkz. The internal clock clkz is actually delayed by one cycle but is apparently caused to lead. Consequently, the clock signal clkdz largely leading the internal clock clkz is output from the DLL 9. Moreover, the command decoder control signal ctlz whose timing largely precedes the timing of determining the states of command information latch signals output from each latch circuit can be produced based on the clock signal clkdz.

As seen from the timing chart of FIG. 19, the DLL shown in FIG. 18 produces the clock signal clkdz leading the external clock CLK. Data DQ synchronous with the clock signal clkdz is output from the data output buffer 54 according to constant timing. When the leading clock signal clkdz is driven to become "H", the command decoder control signal ctlz become "L". Consequently, a sufficient margin can be ensured for the timing of inactivating the command decoder.

As described so far, according to a typical embodiment of the present invention, first, a signal whose timing precedes the timing of a command decoder unit judging the states of various command signals is used to inactivate the command decoder unit. It can therefore be prevented that multi-signal selection of command signals due to a skew occurs when the states of the various command signals are judged.

Furthermore, according to a typical embodiment of the present invention, second, a signal produced by a DLL is used as the signal whose timing precedes the timing of a command decoder unit judging the states of command signals. This results in an expanded margin in timing of actuating or accessing a semiconductor integrated circuit having a semiconductor device.

Furthermore, according to a typical embodiment of the present invention, third, a signal whose timing precedes the timing of judging the states of command signals is used to inactivate a command decoder unit. A signal produced after the states of the command signals are determined is used to activate the command decoder unit. Occurrence of multi-signal selection of command signals due to a skew can therefore be prevented perfectly. Besides, a semiconductor integrated circuit having a semiconductor device enjoying a high processing speed can be realized.

Furthermore, according to a typical embodiment of the present invention, fourth, a signal produced by a dummy latch circuit is used as a signal used to activate a command decoder unit after the states of command signals are determined. The dummy latch circuit monitors the last action of a latch circuit for latching command signals or the like. The occurrence of multi-signal selection of command signals due to a skew can therefore be prevented perfectly and moreover, a semiconductor integrated circuit having a semiconductor device enjoying a high processing speed can be realized.

Furthermore, according to a typical embodiment of the present invention, fifth, a control signal used to inactivate a command decoder unit is produced based on a signal, of which timing precedes the timing of judging the states of command signals, by means of a command decoder control unit. The command decoder control unit is formed with a simple logic circuit. The control signal is then supplied to the command decoder unit. Despite the simple circuitry, multi-signal selection of command signals due to a skew can be prevented perfectly.

What is claimed is:

1. A semiconductor integrated circuit comprising:

a command decoder unit for decoding command signals;

a command decoder control circuit outputting a control signal to said command decoder unit, said control signal resetting said command decoder unit before said command decoder unit decodes said command signals, and said control signal activating said command decoder unit after all of said command signals are input to said command decoder unit; and a command latch circuit for latching external command signals in response to a clock signal and for outputting said command signals to said command decoder unit.

2. The semiconductor integrated circuit according to claim 1, wherein said control signal is generated in response to said clock signal to reset said command decoder unit.

3. The semiconductor integrated circuit according to claim 1, further comprising:

a dummy latch circuit for simulating an operation of said command latch circuit, wherein said control signal is generated in response to an output signal of said dummy latch circuit to activate said command decoder unit.

4. The semiconductor integrated circuit according to claim 1, wherein in a reset state of said command decoder unit, an internal node of said command decoder unit is precharged to a power supply voltage in response to said control signal.

5. The semiconductor integrated circuit according to claim 4, wherein during an activation period of said command decoder unit, said internal node is discharged or not discharged in response to said command signals.

6. The semiconductor integrated circuit according to claim 1, further comprising:

a DLL circuit receiving said clock signal for outputting a controlled clock signal in phase, wherein said control signal is generated in response to said controlled clock signal to reset said command decoder unit.

7. A semiconductor integrated circuit according to claim 1, said command decoder unit comprising:

a first, second and third PMOS transistors coupled in parallel between a power supply voltage and an internal node, and a gate of said first PMOS transistor being controlled by said control signal, gates of said second and third PMOS transistors are controlled by said command signals respectively; and first, second and third NMOS transistors coupled in series between said internal node and a reference potential.

* * * * *